(12) United States Patent
Tahara et al.

(10) Patent No.: US 12,438,507 B2
(45) Date of Patent: Oct. 7, 2025

(54) POWER AMPLIFIER CIRCUIT, RADIO-FREQUENCY CIRCUIT, AND COMMUNICATION DEVICE

(71) Applicant: Murata Manufacturing Co., Ltd., Kyoto (JP)

(72) Inventors: Kenji Tahara, Kyoto (JP); Yoshihiro Daimon, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 675 days.

(21) Appl. No.: 17/805,720

(22) Filed: Jun. 7, 2022

(65) Prior Publication Data

US 2022/0311388 A1    Sep. 29, 2022

Related U.S. Application Data

(63) Continuation of application No. PCT/JP2021/001362, filed on Jan. 15, 2021.

(30) Foreign Application Priority Data

Feb. 14, 2020  (JP) ................................. 2020-023195

(51) Int. Cl.
  *H03F 1/02*  (2006.01)
  *H03F 1/56*  (2006.01)
  (Continued)

(52) U.S. Cl.
  CPC ............. *H03F 1/0233* (2013.01); *H03F 1/56* (2013.01); *H03F 3/245* (2013.01); *H04B 1/04* (2013.01);
  (Continued)

(58) Field of Classification Search
  CPC .......... H03F 1/0233; H03F 1/56; H03F 1/565; H03F 1/0222; H03F 1/0288; H03F 3/245;
  (Continued)

(56) References Cited

U.S. PATENT DOCUMENTS

| | | | |
|---|---|---|---|
| 9,843,294 B2* | 12/2017 | Khlat | ........................ H04B 1/04 |
| 10,439,575 B1* | 10/2019 | Kuo | ........................ H03F 3/265 |
| 2007/0298736 A1* | 12/2007 | Fujioka | ................. H03F 1/0266 455/127.3 |
| 2014/0266462 A1* | 9/2014 | Schirmann | ............ H03F 1/0222 330/295 |
| 2017/0179888 A1 | 6/2017 | Nag et al. | |

(Continued)

FOREIGN PATENT DOCUMENTS

WO    2018/187245 A1    10/2018

OTHER PUBLICATIONS

"Sneijers, Walter, Doherty Architectures in UHF White Paper, p. 2" (Year: 2016).*

(Continued)

*Primary Examiner* — Andrea Lindgren Baltzell
*Assistant Examiner* — Nareh Shamiryan
(74) *Attorney, Agent, or Firm* — McDonald Hopkins LLC

(57) ABSTRACT

A higher-speed operation of a power amplifier circuit is achieved. A power amplifier circuit includes multi-stage amplifier units, an ET terminal, and an APT terminal. The multi-stage amplifier units include a final-stage amplifier unit. The final-stage amplifier unit includes a first amplifier element and a second amplifier element that are connected in parallel with each other. The first amplifier element is connected to the ET terminal. The second amplifier element is connected to the APT terminal.

13 Claims, 8 Drawing Sheets

(51) Int. Cl.
*H03F 3/24* (2006.01)
*H04B 1/04* (2006.01)

(52) U.S. Cl.
CPC .. *H03F 2200/105* (2013.01); *H03F 2200/222* (2013.01); *H03F 2200/387* (2013.01); *H03F 2200/451* (2013.01)

(58) Field of Classification Search
CPC ............... H03F 3/195; H03F 2200/105; H03F 2200/222; H03F 2200/387; H03F 2200/451; H03F 2200/06; H03F 2200/09; H03F 2200/297; H03F 2200/48; H03F 2200/54; H04B 1/04
USPC ............... 330/149, 136, 297, 195, 124 R, 84
See application file for complete search history.

(56) References Cited

U.S. PATENT DOCUMENTS

| | | | |
|---|---|---|---|
| 2018/0309409 A1 | 10/2018 | Khlat | |
| 2019/0229684 A1* | 7/2019 | Wu | H03F 3/45179 |
| 2019/0253023 A1 | 8/2019 | Yang et al. | |
| 2021/0194443 A1* | 6/2021 | Maalouf | H03F 1/0288 |

OTHER PUBLICATIONS

International Search Report for PCT/JP2021/001362 dated Mar. 30, 2021.

\* cited by examiner

POWER AMPLIFIER CIRCUIT, RADIO-FREQUENCY CIRCUIT, AND COMMUNICATION DEVICE

CROSS REFERENCE TO RELATED APPLICATION

This is a continuation of International Application No. PCT/JP2021/001362 filed on Jan. 15, 2021 which claims priority from Japanese Patent Application No. 2020-023195 filed on Feb. 14, 2020. The contents of these applications are incorporated herein by reference in their entireties.

BACKGROUND ART

Technical Field

The present disclosure generally relates to a power amplifier circuit, a radio-frequency circuit, and a communication device and, more specifically, to a power amplifier circuit that includes multi-stage amplifier units, a radio-frequency circuit, and a communication device.

Hitherto, there is known a power management system that includes a plurality of power amplifier circuits, a first tracker circuit, and a second tracker circuit (see, for example, Patent Document 1).

The first tracker circuit generates a first ET modulated voltage according to a first ET modulation signal or a first APT modulated voltage according to a first APT modulation signal. The second tracker circuit generates a second ET modulated voltage according to a second ET modulation signal or a first APT modulated voltage according to a second APT modulation signal.

In the power management system described in Patent Document 1, the first tracker circuit or the second tracker circuit applies a bias voltage to one or more power amplifier circuits selected from among the plurality of power amplifier circuits.

Patent Document 1: U.S. Patent Application Publication No. 2018/0309409

BRIEF SUMMARY

Incidentally, in the technical field of power amplifier circuit, a higher-speed operation of power amplifier circuits is desired.

The present disclosure provides a power amplifier circuit configured to achieve a higher-speed operation, a radio-frequency circuit, and a communication device.

A power amplifier circuit according to one aspect of the present disclosure includes multi-stage amplifier units, an ET terminal, and an APT terminal. The multi-stage amplifier units include a final-stage amplifier unit. The final-stage amplifier unit includes a first amplifier element and a second amplifier element connected in parallel with each other. The first amplifier element is connected to the ET terminal. The second amplifier element is connected to the APT terminal.

A radio-frequency circuit according to one aspect of the present disclosure includes the power amplifier circuit, a first power supply circuit, and a second power supply circuit. The first power supply circuit is connected to the ET terminal and generates a first power supply voltage that changes according to an amplitude of a radio-frequency signal that is input to the first amplifier element. The second power supply circuit is connected to the APT terminal and generates a second power supply voltage that changes according to a change in the amplitude of the radio-frequency signal that is input to the second amplifier element and that changes at a lower frequency than the first power supply voltage.

A communication device according to one aspect of the present disclosure includes the radio-frequency circuit and a signal processing circuit. The signal processing circuit processes the radio-frequency signal and outputs the radio-frequency signal to the radio-frequency circuit. The power amplifier circuit of the radio-frequency circuit amplifies the radio-frequency signal that is input from the signal processing circuit.

With the power amplifier circuit, the radio-frequency circuit, and the communication device according to the above aspects of the present disclosure, it is possible to achieve a higher-speed operation of the power amplifier circuit.

DETAILED DESCRIPTION

Figure 1:
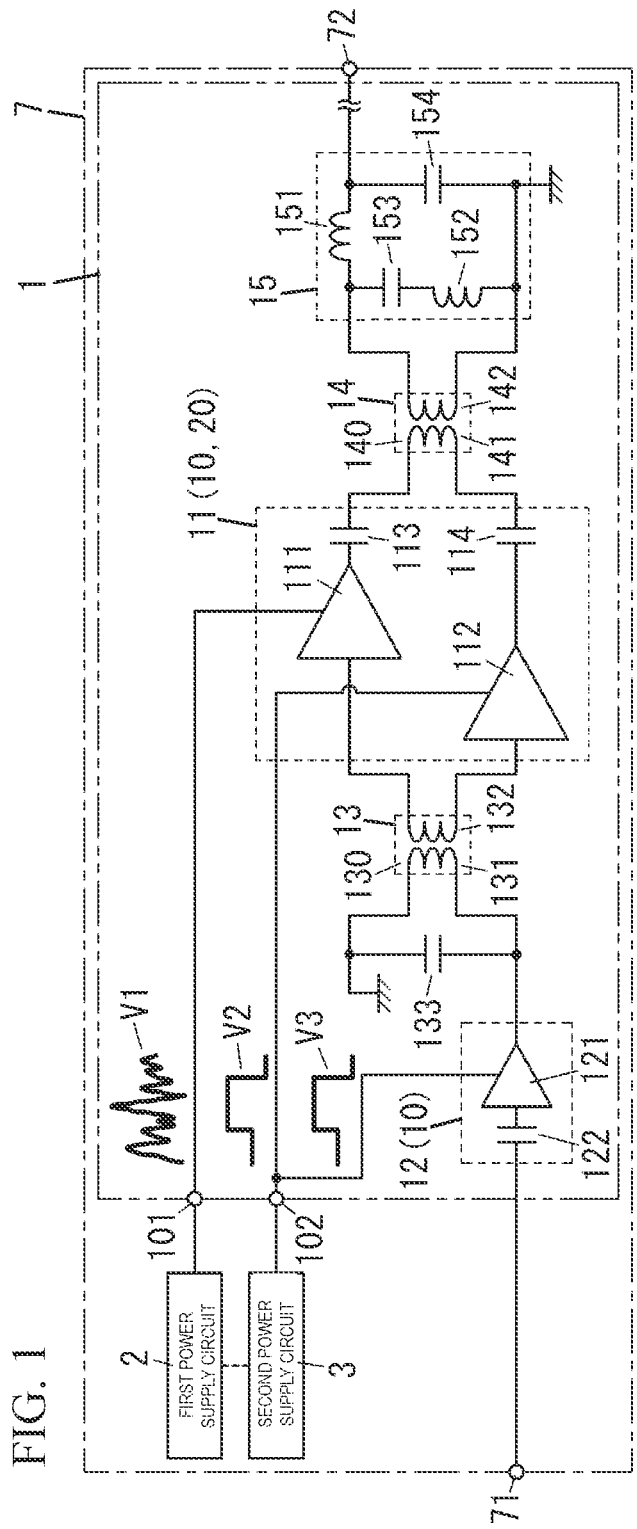
FIG. 1 is a schematic configuration diagram of a power amplifier circuit and a radio-frequency circuit according to a first embodiment.

Figures that will be referenced in the following first to fourth embodiments and the like all are schematic diagrams, and the ratios of the sizes and thicknesses of component elements in the drawings do not always reflect actual scale ratios. In FIG. 1, FIG. 6, FIG. 7, FIG. 9, and FIG. 10, a filter circuit 4 is not shown in radio-frequency circuits 7, 7a, 7b, 7c, 7d, and, in FIG. 2, a first power supply circuit 2 and a second power supply circuit 3 are not shown in the radio-frequency circuit 7.

First Embodiment

Hereinafter, a power amplifier circuit, a radio-frequency circuit, and a communication device according to the first embodiment will be described with reference to FIG. 1 to FIG. 6.

(1) Configuration of Power Amplifier Circuit

Initially, the configuration of a power amplifier circuit 1 according to the first embodiment will be described with reference to the drawings.

As shown in FIG. 1, the power amplifier circuit 1 according to the first embodiment includes a plurality of (two in the illustrated example) amplifier units 10, an ET terminal 101, and an APT terminal 102. In the first embodiment, the power amplifier circuit 1 further includes a splitter 13, a synthesis circuit 14, and an output matching circuit 15.

The plurality of amplifier units 10 includes a final-stage amplifier unit 11 provided on the output side (antenna terminal 72 side) of the power amplifier circuit 1 and a driver-stage amplifier unit 12 provided on the input side (signal input terminal 71 side) of the power amplifier circuit 1, with respect to the splitter 13. In the first embodiment, the number of stages of amplifier units in the power amplifier circuit 1 is two.

The final-stage amplifier unit 11 includes a first amplifier element 111 and a second amplifier element 112. In the first embodiment, the final-stage amplifier unit 11 further includes a plurality of (two in the illustrated example) capacitors 113, 114. In the first embodiment, the first amplifier element 111 and the second amplifier element 112 make up a differential amplifier circuit 20. The driver-stage amplifier unit 12 includes an amplifier element 121 and a capacitor 122.

The first amplifier element 111 is connected to the ET terminal 101. The ET terminal 101 is connected to the first power supply circuit 2 (described later). The first power supply circuit 2 generates a first power supply voltage V1 that changes according to the amplitude of a radio-frequency signal that is input to the first amplifier element 111. The second amplifier element 112 is connected to the APT terminal 102. The APT terminal 102 is connected to the second power supply circuit 3 (described later). The second power supply circuit 3 generates a second power supply voltage V2 that changes according to a change in the amplitude of the radio-frequency signal that is input to the second amplifier element 112 and that changes at a lower frequency than the first power supply voltage V1.

In the specification and the like, the term "connected" means that two connection objects are electrically connected. In the specification and the like, the term "electrically connected" includes the case where two connection objects are directly electrically connected and the case where two connection objects are indirectly connected.

The splitter 13 is provided between the driver-stage amplifier unit 12 and the final-stage amplifier unit 11. The splitter 13 includes a transformer 130. The transformer 130 includes a primary winding 131 and a secondary winding 132. The synthesis circuit 14 is provided between the final-stage amplifier unit 11 and the output matching circuit 15. The synthesis circuit 14 includes a transformer 140. The transformer 140 includes a primary winding 141 and a secondary winding 142.

The output matching circuit 15 is provided between the synthesis circuit 14 and an output-side circuit (for example, the filter circuit 4) of the output matching circuit 15.

As shown in FIG. 1, the power amplifier circuit 1 is used in, for example, the radio-frequency circuit 7. The radio-frequency circuit 7 includes the first power supply circuit 2, the second power supply circuit 3, the filter circuit 4 (see FIG. 2), the signal input terminal 71, and the antenna terminal 72 in addition to the above-described power amplifier circuit 1.

Figure 2:
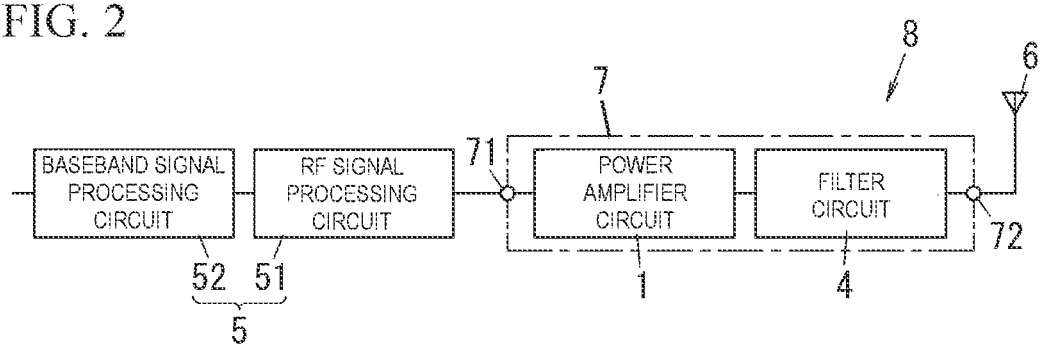
FIG. 2 is a block diagram of a communication device according to the first embodiment.

In addition, as shown in FIG. 2, the radio-frequency circuit 7 is used in, for example, a communication device 8. The communication device 8 is, for example, a mobile phone, such as a smartphone. The communication device 8 is not limited to a mobile phone and may be, for example, a wearable terminal, such as a smart watch, or the like. The radio-frequency circuit 7 is, for example, a circuit that supports a 4G (fourth generation mobile communication) standard, a 5G (fifth generation mobile communication) standard, or the like. The 4G standard is, for example, a 3GPP (Third Generation Partnership Project) LTE (Long Term Evolution) standard. The 5G standard is, for example, 5G NR (New Radio). The radio-frequency circuit 7 may be a circuit that supports carrier aggregation and dual connectivity.

(2) Component Elements of Power Amplifier Circuit

Next, the component elements of the power amplifier circuit 1 according to the first embodiment will be described with reference to FIG. 1.

(2.1) Final-Stage Amplifier Unit

As shown in FIG. 1, the final-stage amplifier unit 11 includes the first amplifier element 111 and the second amplifier element 112. In the first embodiment, the final-stage amplifier unit 11 further includes the plurality of (two in the illustrated example) capacitors 113, 114. In the first embodiment, the capacitor 113 is associated with the first amplifier element 111, and the capacitor 114 is associated with the second amplifier element 112.

Each of the first amplifier element 111 and the second amplifier element 112 is, for example, an npn-type bipolar transistor. More specifically, each of the first amplifier element 111 and the second amplifier element 112 is an HBT (Heterojunction Bipolar Transistor). Each of the first amplifier element 111 and the second amplifier element 112 is a multi-finger transistor in which a plurality of unit transistors (also referred to as "fingers") is connected in parallel. The unit transistor means a minimum configuration of a transistor. Each of the first amplifier element 111 and the second amplifier element 112 amplifies a radio-frequency signal from an RF signal processing circuit (see FIG. 2) of a signal processing circuit 5 (described later). In the first embodiment, the first amplifier element 111 and the second amplifier element 112 are connected in parallel with each other and make up the differential amplifier circuit 20.

In the first embodiment, the size of the first amplifier element 111 is the same as the size of the second amplifier element 112. As in the case of the first embodiment, each of the first amplifier element 111 and the second amplifier element 112 is a multi-finger transistor, the number of unit transistors increases as the size increases, and the number of unit transistors reduces as the size reduces. Therefore, in the first embodiment, since the size of the first amplifier element 111 is the same as the size of the second amplifier element 112, the number of unit transistors that make up the first amplifier element 111 is the same as the number of unit transistors that make up the second amplifier element 112.

The first amplifier element 111 has a first base terminal, a first collector terminal, and a first emitter terminal. The first amplifier element 111 amplifies a radio-frequency signal that is input to the first base terminal and outputs the radio-frequency signal from the first collector terminal. The first emitter terminal is electrically connected to a ground. In other words, the first emitter terminal is directly or indirectly connected to the ground. In other words, the first emitter terminal is grounded (common-emitter). The first collector terminal is electrically connected to the first power supply circuit (described later) via the ET terminal 101, and a first power supply voltage V1 is applied (supplied) to the first collector terminal. The first collector terminal is also electrically connected to a first end of the primary winding 141 of the transformer 140 of the synthesis circuit 14 via the capacitor 113. In addition, the first base terminal is electrically connected to a first end of the secondary winding 132 of the transformer 130 of the splitter 13.

The second amplifier element 112 has a second base terminal, a second collector terminal, and a second emitter terminal. The second amplifier element 112 amplifies a radio-frequency signal that is input to the second base terminal and outputs the radio-frequency signal from the second collector terminal. The second emitter terminal is electrically connected to the ground. In other words, the second emitter terminal is directly or indirectly connected to the ground. In other words, the second emitter terminal is grounded (common-emitter). The second collector terminal is electrically connected to the second power supply circuit (described later) via the APT terminal 102, and a second power supply voltage V2 is applied (supplied) to the second collector terminal. The second collector terminal is also electrically connected to a second end of the primary winding 141 of the transformer 140 via the capacitor 114. In addition, the second base terminal is electrically connected to a second end of the secondary winding 132 of the transformer 130.

In other words, in the power amplifier circuit 1 according to the first embodiment, the first base terminal of the first amplifier element 111 and the second base terminal of the second amplifier element 112 are electrically connected to each other via the secondary winding 132 of the transformer 130. The first collector terminal of the first amplifier element 111 and the second collector terminal of the second amplifier element 112 are electrically connected to each other via the capacitors 113, 114 and the primary winding 141 of the transformer 140.

The capacitor 113 is a DC-cut capacitor that cuts a DC component (direct-current component) that is output from the first amplifier element 111. The capacitor 114 is a DC-cut capacitor that cuts a DC component that is output from the second amplifier element 112.

Here, the first base terminal of the first amplifier element 111 and the second base terminal of the second amplifier element 112 each corresponds to the base of the HBT. The first collector terminal of the first amplifier element 111 and the second collector terminal of the second amplifier element 112 each corresponds to the collector of the HBT. In addition, the first emitter terminal of the first amplifier element 111 and the second emitter terminal of the second amplifier element 112 each corresponds to the emitter of the HBT. This also applies to an amplifier element 121 (described later).

(2.2) Driver-Stage Amplifier Unit

As shown in FIG. 1, the driver-stage amplifier unit 12 includes the amplifier element 121 and the capacitor 122.

The amplifier element 121, as in the case of the first amplifier element 111 and the second amplifier element 112, is, for example, an npn-type bipolar transistor. More specifically, the amplifier element 121 is an HBT. The amplifier element 121, as in the case of the first amplifier element 111 and the second amplifier element 112, is a multi-finger transistor in which a plurality of unit transistors is connected in parallel. The amplifier element 121 amplifies a radio-frequency signal from the RF signal processing circuit 51 (see FIG. 2) of the signal processing circuit 5 (described later).

The amplifier element 121 has a base terminal, a collector terminal, and an emitter terminal. The amplifier element 121 amplifies a radio-frequency signal that is input to the base terminal and outputs the radio-frequency signal from the collector terminal. The emitter terminal is electrically connected to the ground. In other words, the emitter terminal is directly or indirectly connected to the ground. In other words, the emitter terminal is grounded (common-emitter). The collector terminal is electrically connected to the second power supply circuit 3 (described later) via the APT terminal 102, and a third power supply voltage V3 is applied (supplied) to the collector terminal. The collector terminal is also electrically connected to a first end of the primary winding 131 of the transformer 130. In addition, the base terminal is electrically connected to the signal input terminal 71 via the capacitor 122.

The capacitor 122 is a DC-cut capacitor that cuts a DC component that is input to the amplifier element 121.

(2.3) Splitter

The splitter 13 is a circuit for providing electrical isolation between the driver-stage amplifier unit 12 and the final-stage amplifier unit 11. As shown in FIG. 1, the splitter 13 includes the transformer 130. As shown in FIG. 1, the transformer 130 includes the primary winding 131 and the secondary winding 132.

The first end of the primary winding 131 is electrically connected to the collector terminal of the amplifier element 121. A second end of the primary winding 131 is electrically connected to the ground. In addition, a capacitor 133 is electrically connected between the first end and the second end of the primary winding 131.

The first end of the secondary winding 132 is electrically connected to the first base terminal of the first amplifier element 111. The second end of the secondary winding 132 is electrically connected to the second base terminal of the second amplifier element 112. The turn ratio of the primary winding 131 to the secondary winding 132 is, for example, 1:1.

(2.4) Synthesis Circuit

The synthesis circuit 14 is a circuit for providing electrical isolation between the final-stage amplifier unit 11 and the output matching circuit 15. As shown in FIG. 1, the synthesis circuit 14 includes the transformer 140. As shown in FIG. 1, the transformer 140 includes the primary winding 141 and the secondary winding 142.

The first end of the primary winding 141 is electrically connected to the first collector terminal of the first amplifier element 111 via the capacitor 113. The second end of the primary winding 141 is electrically connected to the second collector terminal of the second amplifier element 112 via the capacitor 114.

A first end of the secondary winding 142 is electrically connected to a first input terminal of the output matching circuit 15 (a junction point between the inductor 151 and the capacitor 153). A second end of the secondary winding 142 is electrically connected to a second input terminal of the output matching circuit 15 (an end portion of the inductor 152 on the side opposite from the capacitor 153) and is also electrically connected to the ground. The turn ratio of the primary winding 141 to the secondary winding 142 is, for example, 1:1.

(2.5) Output Matching Circuit

As shown in FIG. 1, the output matching circuit 15 is provided on the secondary side of the synthesis circuit 14. The output matching circuit 15 is a circuit for matching the impedance between the input-side circuit (the final-stage amplifier unit 11 and the synthesis circuit 14) of the output matching circuit 15 and the output-side circuit (for example, the filter circuit 4) of the output matching circuit 15. The output matching circuit 15 includes the two inductors 151, 152 and the two capacitors 153, 154.

A first end of the inductor 151 is electrically connected to the first end of the secondary winding 142 of the transformer 140, and a second end of the inductor 151 is electrically connected to an input end of the filter circuit (see FIG. 2). The inductor 152 is connected in series with the capacitor 153 and is electrically connected between both ends of the secondary winding 142 of the transformer 140 together with the capacitor 153. An end portion of the capacitor 153 on the side opposite from the inductor 152 is electrically connected to a junction point between the inductor 151 and the secondary winding 142 of the transformer 140. The capacitor 154 is electrically connected between both ends of the secondary winding 142 of the transformer 140 via the inductor 151.

(3) Component Elements of Radio-Frequency Circuit

Next, the component elements of the radio-frequency circuit 7 according to the first embodiment will be described with reference to FIG. 1 and FIG. 2.

As shown in FIG. 1, the radio-frequency circuit 7 according to the first embodiment includes the power amplifier circuit 1, the first power supply circuit 2, and the second power supply circuit 3. In the first embodiment, as shown in FIG. 2, the radio-frequency circuit 7 further includes the filter circuit 4, the signal input terminal 71, and the antenna terminal 72.

(3.1) Terminals

As shown in FIG. 2, the signal input terminal 71 is electrically connected to the RF signal processing circuit 51 of the signal processing circuit 5 (described later). The signal input terminal 71 is a terminal for inputting a radio-frequency signal (transmission signal) from the RF signal processing circuit 51 to the radio-frequency circuit 7.

As shown in FIG. 2, the antenna terminal 72 is electrically connected to an antenna 6 (described later). In the first embodiment, the antenna terminal 72 is a terminal for outputting a radio-frequency signal from the radio-frequency circuit 7 to the antenna 6.

(3.2) First Power Supply Circuit

The first power supply circuit 2 is, for example, an ET (Envelope Tracking) modulator. The first power supply circuit 2 includes, for example, a DC-DC converter. As described above, the first power supply circuit 2 applies (supplies) a first power supply voltage V1 to (the first collector terminal of) the first amplifier element 111. The first power supply circuit 2 detects an envelope (envelope) of a signal output from a baseband signal processing circuit (see FIG. 2) (described later). In other words, the first power supply circuit 2 detects the waveform (envelope signal) of an amplitude-modulated carrier wave signal that is a component of a transmission signal. Specifically, the first power supply circuit 2 detects an envelope signal from an I-phase signal and a Q-phase signal.

The first power supply circuit 2 generates the first power supply voltage V1 by using the waveform of the envelope signal and a preset amplification rate. The first power supply voltage V1 changes according to the envelope. The period of the first power supply voltage V1 is the same as the period of the envelope signal. The amplitude variation of the first power supply voltage V1 is the same as the amplitude variation of the envelope signal. In other words, the amplitude characteristics (period and amplitude variation) of the envelope signal and the first power supply voltage V1 are the same. The first power supply circuit 2 outputs the generated first power supply voltage V1 to the first amplifier element 111.

Figure 3A:
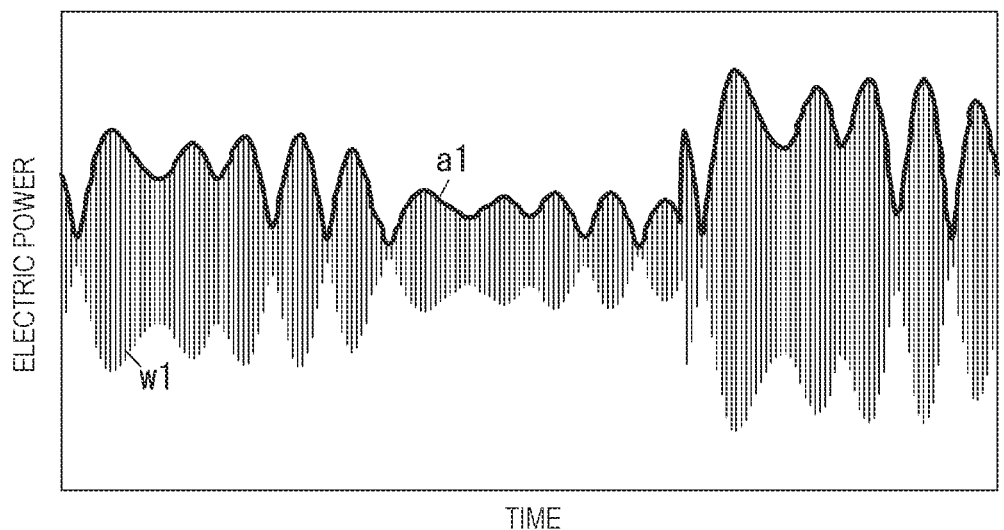
FIG. 3A relates to a power amplifier circuit according to a comparative example and is a graph showing a change in first power supply voltage that is applied from a first power supply circuit to a first amplifier element.

FIG. 3A is a graph showing an example of the first power supply voltage V1 that is output from the first power supply circuit 2. As represented by the continuous line a1 in FIG. 3A, the first power supply voltage V1 changes according to a change in the amplitude of the radio-frequency signal. Therefore, the first amplifier element 111 is operable in a state close to a saturated state. In FIG. 3A, "w1" indicates the waveform of the radio-frequency signal. In other words, a signal input from the first power supply circuit 2 to the ET terminal 101 is a signal that changes following the envelope of the radio-frequency signal that is input to the first amplifier element 111.

Incidentally, in the radio-frequency circuit 7 according to the first embodiment, the first power supply circuit 2 is configured to acquire voltage information from the second power supply circuit 3. The voltage information is information on the second power supply voltage V2 output from the second power supply circuit 3 and is information on a change in the amplitude of the second power supply voltage V2. In other words, the first power supply circuit 2 holds the amplitude of the second power supply voltage V2 in each of time periods T1, T2, T3 (see FIG. 3B).

(3.3) Second Power Supply Circuit

The second power supply circuit 3 is, for example, a circuit that generates the second power supply voltage V2 and the third power supply voltage V3 in accordance with an APT (Average Power Tracking) system. The second power supply circuit 3 includes, for example, a DC-DC converter. The second power supply circuit 3 calculates the average power amplitude of the radio-frequency signal for each predetermined time period (time periods T1, T2, T3 (described later)) and changes a voltage supply level to the second amplifier element 112 and the amplifier element 121 according to the calculated average power amplitude.

In the first embodiment, the frequency of the second power supply voltage V2 and the frequency of the third power supply voltage V3 are the same. In the specification, the state "frequencies are the same" includes not only the case where two frequencies completely coincide with each other but also the case where one frequency falls within a certain range (for example, ±5%) with respect to the other frequency. In the first embodiment, it is assumed that the amplitude of the second power supply voltage V2 is the same as the amplitude of the third power supply voltage V3; however, the amplitude of the second power supply voltage V2 may be different from the amplitude of the third power supply voltage V3.

Figure 3B:
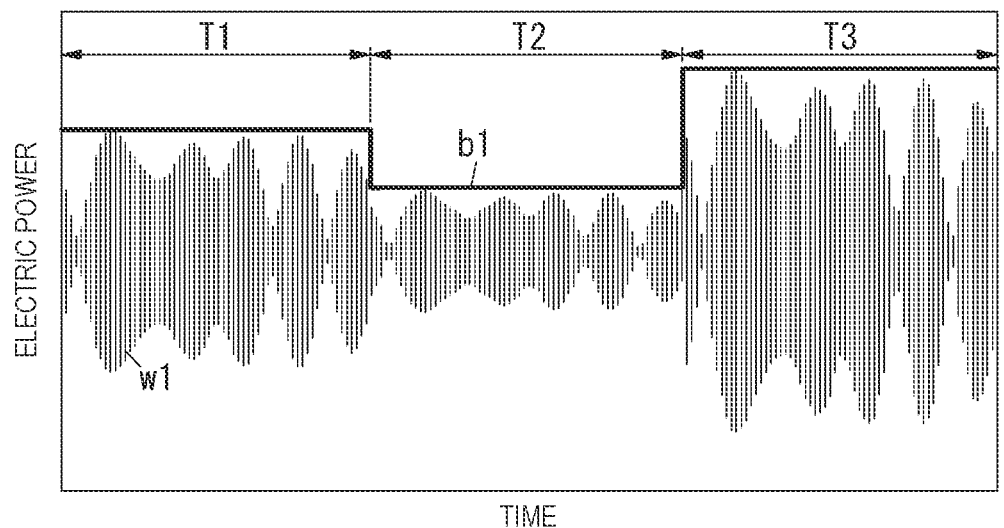
FIG. 3B relates to the above same power amplifier circuit and is a graph showing a change in second power supply voltage that is applied from a second power supply circuit to the first amplifier element.

FIG. 3B is a graph showing an example of the second power supply voltage V2 and the third power supply voltage V3 output from the second power supply circuit 3. In the example of FIG. 3B, as represented by the continuous line b1, the second power supply circuit 3 calculates the average power amplitude of the radio-frequency signal in each of the continuous three time periods T1, T2, T3 and changes the voltage supply level (amplitude) of each of the second power supply voltage V2 and the third power supply voltage V3 in each of the three time periods T1, T2, T3 according to the calculated average power amplitude. In other words, a signal input from the second power supply circuit 3 to the APT terminal 102 is a signal that changes according to the average amplitude of the radio-frequency signal detected in each of the predetermined time periods T1, T2, T3.

(3.4) Filter Circuit

The filter circuit 4 is a filter that has a transmission band of a specific communication band (for example, Band 3) as a pass band. The filter circuit 4 is, for example, a one-chip acoustic wave filter, and each of a plurality of series arm resonators and a plurality of parallel arm resonators is made up of an acoustic wave resonator. The acoustic wave filter is, for example, a surface acoustic wave filter that uses surface acoustic waves. In the surface acoustic wave filter, each of the plurality of series arm resonators and the plurality of parallel arm resonators is, for example, an SAW (Surface Acoustic Wave) resonator.

(4) Component Elements of Communication Device

Next, the component elements of the communication device 8 according to the first embodiment will be described with reference to FIG. 2.

As shown in FIG. 2, the communication device 8 according to the first embodiment further includes the signal processing circuit 5 and the antenna 6 in addition to the above-described radio-frequency circuit 7.

(4.1) Signal Processing Circuit

As shown in FIG. 2, the signal processing circuit 5 includes the RF signal processing circuit 51 and the baseband signal processing circuit 52. In the first embodiment, the signal processing circuit 5 processes a radio-frequency signal (transmission signal) to the radio-frequency circuit 7.

(4.1.1) RF Signal Processing Circuit

The RF signal processing circuit 51 is electrically connected to the signal input terminal 71 of the radio-frequency circuit 7. The RF signal processing circuit 51 is, for example, an RFIC (Radio Frequency Integrated Circuit) and performs signal processing on a radio-frequency signal (transmission signal) from the baseband signal processing circuit 52. The RF signal processing circuit 51 performs signal processing, such as up conversion, on a radio-frequency signal output from the baseband signal processing circuit 52 and outputs the processed radio-frequency signal to the radio-frequency circuit 7.

(4.1.2) Baseband Signal Processing Circuit

The baseband signal processing circuit 52 is, for example, a BBIC (Baseband Integrated Circuit). The baseband signal processing circuit 52 generates an I-phase signal and a Q-phase signal from a baseband signal. The baseband signal is, for example, an audio signal, an image signal, or the like input from the outside. The baseband signal processing circuit 52 performs IQ modulation process by synthesizing the I-phase signal with the Q-phase signal and outputs a transmission signal. At this time, the transmission signal is generated as a modulation signal (IQ signal) obtained by modulating the amplitude of a carrier wave signal with a predetermined frequency at a period longer than the period of the carrier wave signal.

(4.2) Antenna

The antenna 6 is electrically connected to the antenna terminal 72 of the radio-frequency circuit 7. The antenna 6 has a transmission function of radiating a transmission signal (radio-frequency signal) output from the radio-frequency circuit 7 by radio waves.

(5) Operation of Power Amplifier Circuit

Next, the operation of the power amplifier circuit 1 according to the first embodiment will be described with reference to FIG. 3A, FIG. 3B, and FIG. 4.

The power amplifier circuit 1 according to the first embodiment, for example, amplifies a radio-frequency signal (transmission signal) output from the signal processing circuit 5 and outputs the amplified radio-frequency signal to the subsequent filter circuit 4 (see FIG. 2). In other words, the power amplifier circuit 1 according to the first embodiment amplifies a radio-frequency signal input from the signal input terminal 71 and outputs the amplified radio-frequency signal to the filter circuit 4.

Here, it is assumed that the final-stage amplifier unit 11 includes only the first amplifier element 111 and applies the first power supply voltage V1 from the first power supply circuit 2 to the first amplifier element 111. In this case, as shown in FIG. 3A, the amplitude of the first power supply voltage V1 is changed according to a change in the amplitude of the radio-frequency signal. Therefore, the loss (loss) of power consumption of the first amplifier element 111 is reduced. However, in this case, a variation in the amplitude of the first power supply voltage V1 is large, so there is an inconvenience that the response of the first amplifier element 111 decreases.

It is assumed that the final-stage amplifier unit 11 includes only the first amplifier element 111 and applies the second power supply voltage V2 from the second power supply circuit 3 to the first amplifier element 111. In this case, as shown in FIG. 3B, the voltage supply level (amplitude) of the second power supply voltage V2 is changed according to the average power amplitude of the radio-frequency signal, calculated for each of the predetermined time periods (time periods T1, T2, T3). Therefore, a decrease in the response of the first amplifier element 111 is reduced. However, in this case, since the difference between the amplitude of the radio-frequency signal and the amplitude of the second power supply voltage V2 is large, there is an inconvenience that the loss (loss) of power consumption of the first amplifier element 111 increases.

In the power amplifier circuit 1 according to the first embodiment, for the purpose of suppressing a decrease in the response of the first amplifier element 111 while reducing the loss of power consumption of the first amplifier element 111, the first power supply voltage V1 is applied (supplied) to the first amplifier element 111, and the second power supply voltage V2 is applied (supplied) to the second amplifier element 112. In addition, in the power amplifier circuit 1 according to the first embodiment, the first power supply circuit 2 holds a change in the amplitude of the second power supply voltage V2 that is the output voltage of the second power supply circuit 3 and changes the first power supply voltage V1 with reference to the second power supply voltage V2.

Figure 4:
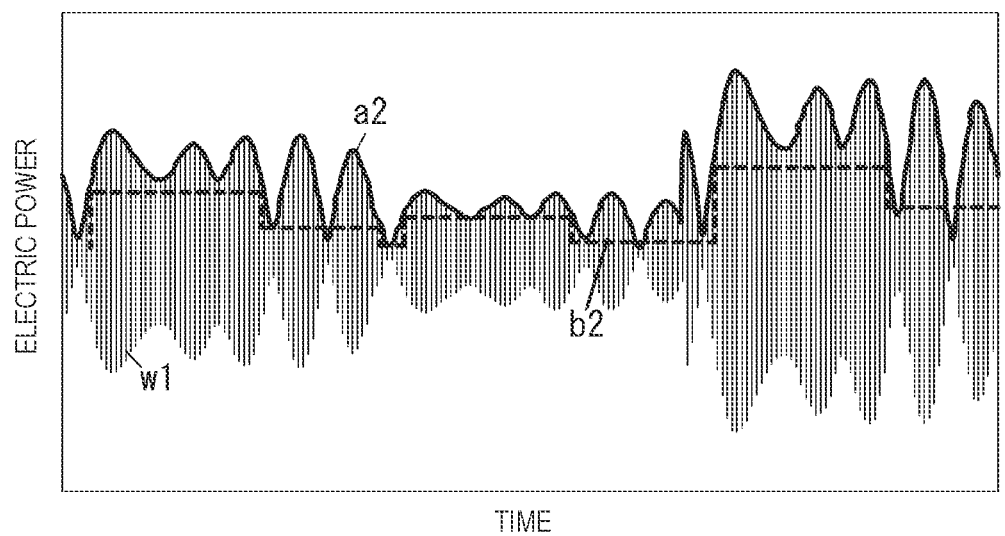
FIG. 4 relates to the power amplifier circuit according to the first embodiment and is a graph showing a change in first power supply voltage that is applied from a first power supply circuit to a first amplifier element.

FIG. 4 is a graph showing a change in the first power supply voltage V1 that is applied to (the first collector terminal of) the first amplifier element 111 of the power amplifier circuit 1 according to the first embodiment. In FIG. 4, the continuous line a2 represents the first power supply voltage V1, and the dashed line b2 represents the second power supply voltage V2. In FIG. 4, "w1" indicates the waveform of a radio-frequency signal that is input from the RF signal processing circuit 51.

As described above, the first power supply circuit 2 holds a change in the amplitude of the second bias voltage V2 that is output from the second power supply circuit 3.

Here, in the first embodiment, as described above, the size of the first amplifier element 111 is the same as the size of the second amplifier element 112. Therefore, the first power supply voltage V1 is applied to the first amplifier element 111 that generates a half of resultant power obtained from the final-stage amplifier unit 11, and the second power supply voltage V2 is applied to the second amplifier element 112 that generates the remaining half. Therefore, as shown in FIG. 4, the first power supply circuit 2 changes the first power supply voltage V1 by the amount of change from the second power supply voltage V2 with reference to the second power supply voltage V2. Thus, the width of change in the amplitude of the first power supply voltage V1 is reduced to about the half. As a result, it is possible to suppress a decrease in the response of the first amplifier element 111, and it is possible to achieve a higher-speed operation of the power amplifier circuit 1. In comparison with the case where the second power supply voltage V2 is applied to the first amplifier element 111, the loss of power consumption of the first amplifier element 111 is reduced.

(6) Characteristics of Power Amplifier Circuit

Next, the characteristics of the power amplifier circuit 1 according to the first embodiment will be described with reference to FIG. 5.

Figure 5:
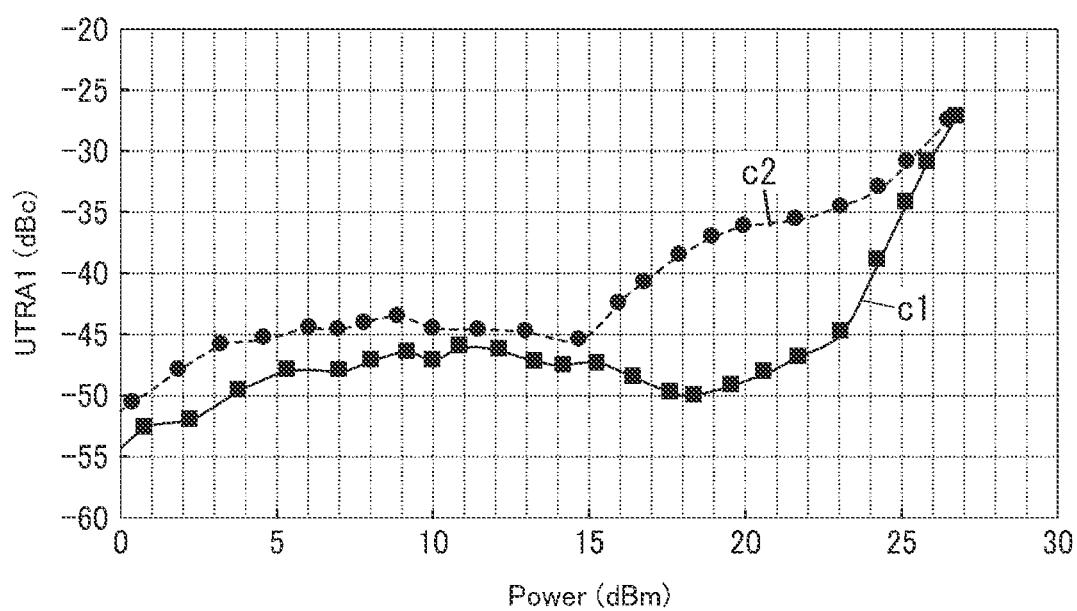
FIG. 5 is a graph showing the ACLR characteristics of the above same power amplifier circuit.

FIG. 5 is a graph showing the ACLR (Adjacent Channel Leakage Ratio) characteristics of the power amplifier circuit 1 according to the first embodiment. In FIG. 5, the ACLR characteristics of a power amplifier circuit according to a comparative example are shown together. In FIG. 5, the continuous line c1 represents the ACLR characteristics of the power amplifier circuit 1 according to the first embodiment, and the dashed line c2 represents the ACLR characteristics of the power amplifier circuit according to the comparative example. In FIG. 5, "UTRA1" indicates a leakage power ratio in 5 MHz detuning. Here, in FIG. 5, the band width of the radio-frequency signal (transmission signal) is, for example, 60 MHz.

In the power amplifier circuit 1 according to the first embodiment, the first power supply voltage V1 is applied to the first amplifier element 111, the second power supply voltage V2 is applied to the second amplifier element 112, and the leakage power ratio UTRA1 changes as represented by the continuous line c1. Specifically, in the power amplifier circuit 1 according to the first embodiment, UTRA1 is lower than −45 dBc in the range in which the output power is lower than or equal to 23 dBm, and UTRA1 is higher than −45 dBc in the range in which the output power is higher than 23 dBm.

On the other hand, in the power amplifier circuit according to the comparative example, the first power supply voltage V1 is applied to the first amplifier element 111, and the leakage power ratio UTRA1 changes as represented by the dashed line c2. Specifically, in the power amplifier circuit according to the comparative example, UTRA1 is about −45 dBc in the range in which the output power is lower than or equal to 15 dBm, and UTRA1 is higher than −45 dBc in the range in which the output power is higher than 15 dBm.

In other words, with the power amplifier circuit 1 according to the first embodiment, the range of output power in which UTRA1 is lower than or equal to −45 dBc is increased as compared to the power amplifier circuit according to the comparative example. In other words, with the power amplifier circuit 1 according to the first embodiment, UTRA1 is suppressed to lower than or equal to −45 dBc for a wide-range output power.

(7) Advantageous Effects

As described above, in the power amplifier circuit 1 according to the first embodiment, the first amplifier element 111 is connected to the ET terminal 101, and the second amplifier element 112 is connected to the APT terminal 102. In the power amplifier circuit 1 according to the first embodiment, the first amplifier element 111 and the second amplifier element 112 are connected in parallel with each other. Therefore, resultant power output from the final-stage amplifier unit 11 is able to be split into two for the first amplifier element 111 and the second amplifier element 112. Thus, it is possible to reduce the amplitude of voltage (first power supply voltage V1) that is applied to the first amplifier element 111. As a result, it is possible to suppress a decrease in the response of the first amplifier element 111, and a higher-speed operation of the power amplifier circuit 1 is possible.

In the power amplifier circuit 1 according to the first embodiment, the transformer 140 is provided between the final-stage amplifier unit 11 and the filter circuit 4. Thus, the band width of a radio-frequency signal is widened.

(8) Modifications

The first embodiment is just one of various embodiments of the present disclosure. The first embodiment may be modified into various forms according to design, or the like of the present disclosure is achieved. Hereinafter, modifications of the first embodiment will be described.

(8.1) First Modification

In the first embodiment, the synthesis circuit 14 is provided between the final-stage amplifier unit 11 and the antenna terminal 72; however, the synthesis circuit 14 may be omitted. In the first embodiment, the splitter 13 is provided between the driver-stage amplifier unit 12 and the final-stage amplifier unit 11; however, the splitter 13 may also be omitted. Hereinafter, a power amplifier circuit 1a and a radio-frequency circuit 7a according to the first modification will be described with reference to FIG. 6. The first power supply circuit 2 and the second power supply circuit 3 are similar to the radio-frequency circuit 7 according to the first embodiment, so the description is omitted here.

Figure 6:
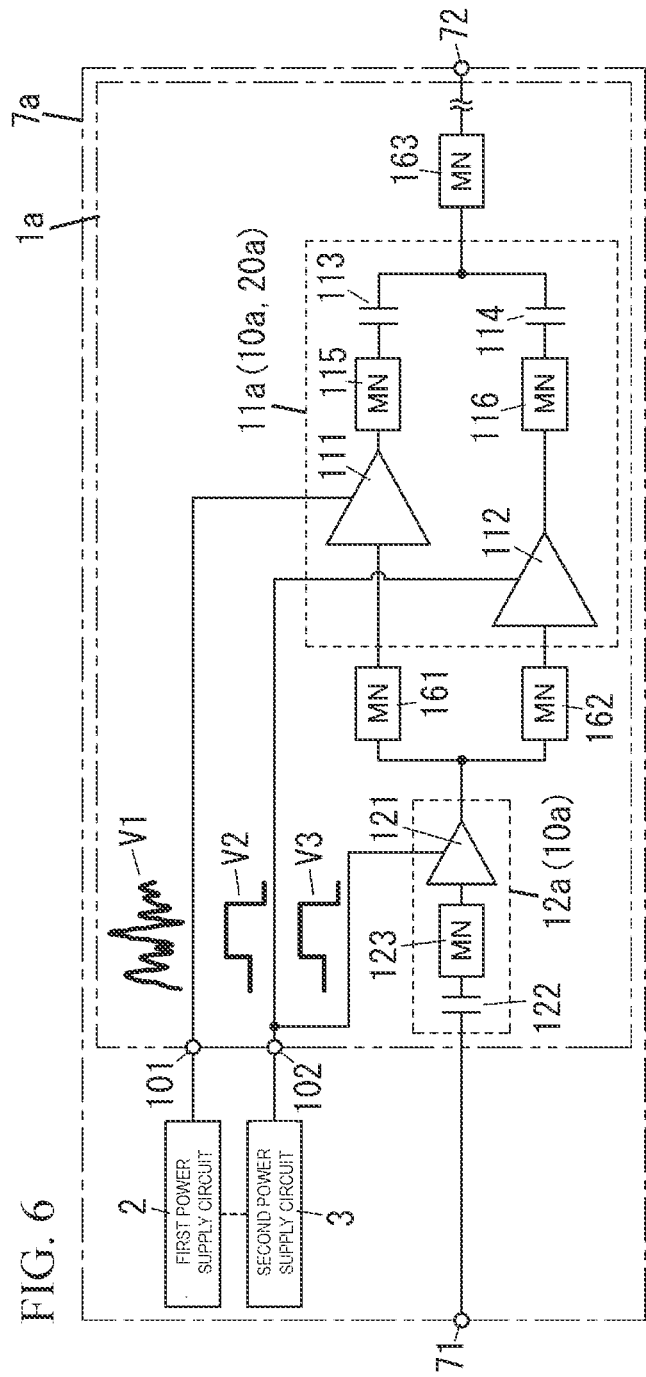
FIG. 6 is a schematic configuration diagram of a power amplifier circuit and a radio-frequency circuit according to a first modification of the first embodiment.

As shown in FIG. 6, the radio-frequency circuit 7a according to the first modification includes the power amplifier circuit 1a, the first power supply circuit 2, and the second power supply circuit 3. In the first modification, the radio-frequency circuit 7a further includes the signal input terminal 71, the antenna terminal 72, and a filter circuit (not shown).

(8.1.1) Component Elements of Power Amplifier Circuit

Next, the component elements of the power amplifier circuit 1a according to the first modification will be described with reference to FIG. 6.

As shown in FIG. 6, the power amplifier circuit 1a according to the first modification includes multi-stage (two-stage in the illustrated example) amplifier units 10a, the ET terminal 101, and the APT terminal 102. The multi-stage amplifier units 10a include a final-stage amplifier unit 11a and a driver-stage amplifier unit 12a. In the first modification, the power amplifier circuit 1a further includes a plurality of (three in the illustrated example) matching circuits 161, 162, 163.

(8.1.1.1) Final-Stage Amplifier Unit

As shown in FIG. 6, the final-stage amplifier unit 11a includes the first amplifier element 111 and the second amplifier element 112. In the first modification, the final-stage amplifier unit 11a further includes the plurality of (two in the illustrated example) capacitors 113, 114 and a plurality of (two in the illustrated example) matching circuits 115, 116.

The matching circuit 115 is a circuit for matching the impedance between the final-stage amplifier unit 11a and a subsequent filter circuit (not shown). The matching circuit 115 is provided between the first amplifier element 111 and the capacitor 113.

The matching circuit 116, as in the case of the matching circuit 115, is a circuit for matching the impedance between the final-stage amplifier unit 11a and the subsequent filter circuit (not shown). The matching circuit 116 is provided between the second amplifier element 112 and the capacitor 114.

Each of the matching circuits 115, 116 includes, for example, a plurality of inductors (not shown) and a plurality of capacitors (not shown). Each of the matching circuits 115, 116 is not limited to the configuration including a plurality of inductors and a plurality of capacitors and may be, for example, a configuration including only a plurality of inductors or a configuration including only a plurality of capacitors. Alternatively, each of the matching circuits 115, 116 may be a configuration including only one inductor or may be a configuration including only one capacitor.

In the power amplifier circuit 1a according to the first modification, as in the case of the power amplifier circuit 1 according to the first embodiment, the first amplifier element 111 and the second amplifier element 112 are connected in parallel with each other and make up a differential amplifier circuit 20a. A first power supply voltage V1 from the first power supply circuit 2 is applied to the first amplifier element 111 via the ET terminal 101, and a second power supply voltage V2 from the second power supply circuit 3 is applied to the second amplifier element 112 via the APT terminal 102.

(8.1.1.2) Driver-Stage Amplifier Unit

As shown in FIG. 6, the driver-stage amplifier unit 12a includes the amplifier element 121, the capacitor 122, and a matching circuit 123.

The matching circuit 123 is a circuit for matching the impedance between a preceding RF signal processing circuit (not shown) and the driver-stage amplifier unit 12a. The matching circuit 123 is provided between the amplifier element 121 and the capacitor 122.

The matching circuit 123 includes, for example, a plurality of inductors (not shown) and a plurality of capacitors (not shown). The matching circuit 123 is not limited to the configuration including a plurality of inductors and a plurality of capacitors and may be, for example, a configuration including only a plurality of inductors or a configuration including only a plurality of capacitors. Alternatively, the matching circuit 123 may be a configuration including only one inductor or may be a configuration including only one capacitor.

(8.1.1.3) Matching Circuit

The matching circuit 161 is a circuit for matching the impedance between the driver-stage amplifier unit 12a and the final-stage amplifier unit 11a. The matching circuit 161 is provided between the amplifier element 121 of the driver-stage amplifier unit 12a and the first amplifier element 111 of the final-stage amplifier unit 11a.

The matching circuit 162, as in the case of the matching circuit 161, is a circuit for matching the impedance between the driver-stage amplifier unit 12a and the final-stage amplifier unit 11a. The matching circuit 162 is provided between the amplifier element 121 of the driver-stage amplifier unit 12a and the second amplifier element 112 of the final-stage amplifier unit 11a.

The matching circuit 163 is a circuit for matching the impedance between the final-stage amplifier unit 11a and a subsequent filter circuit (not shown). The matching circuit 163 is provided between the capacitors 113, 114 of the final-stage amplifier unit 11a and the input end of the filter circuit.

Each of the matching circuits 161, 162, 163 includes, for example, a plurality of inductors (not shown) and a plurality of capacitors (not shown). Each of the matching circuits 161, 162, 163 is not limited to the configuration including a plurality of inductors and a plurality of capacitors and may be, for example, a configuration including only a plurality of inductors or a configuration including only a plurality of capacitors. Alternatively, each of the matching circuits 161, 162, 163 may be a configuration including only one inductor or may be a configuration including only one capacitor.

In the power amplifier circuit 1a according to the first modification, as in the case of the power amplifier circuit 1 according to the first embodiment, the first amplifier element 111 is connected to the ET terminal 101, and the second amplifier element 112 is connected to the APT terminal 102. In the power amplifier circuit 1a according to the first modification, the first amplifier element 111 and the second amplifier element 112 are connected in parallel with each other. Therefore, resultant power output from the final-stage amplifier unit 11a is able to be split into two for the first amplifier element 111 and the second amplifier element 112. Thus, it is possible to reduce the amplitude of voltage (first power supply voltage V1) that is applied to the first amplifier element 111. As a result, it is possible to suppress a decrease in the response of the first amplifier element 111, and a higher-speed operation of the power amplifier circuit 1 is possible.

(8.2) Other Modifications

Hereinafter, other modifications will be described below.

In the first embodiment and the first modification, the number of stages of amplifier units is two. Alternatively, the number of stages of amplifier units may be three or more. For example, another amplifier unit may be provided between the driver-stage amplifier unit 12 and the final-stage amplifier unit 11 or between the driver-stage amplifier unit 12a and the final-stage amplifier unit 11a.

In the first embodiment and the first modification, each of the first amplifier element 111, the second amplifier element 112, and the amplifier element 121 includes an npn-type bipolar transistor. Alternatively, each of the first amplifier element 111, the second amplifier element 112, and the amplifier element 121 may include, for example, a pnp-type bipolar transistor. Alternatively, each of the first amplifier element 111, the second amplifier element 112, and the amplifier element 121 may include a field effect transistor, such as a MOSFET (Metal Oxide Field-Effect Transistor). In this case, the size of each of the first amplifier element 111, the second amplifier element 112, and the amplifier element 121 depends on the gate width of the MOSFET that makes up each amplifier element. For example, when the size of the first amplifier element 111 is the same as the size of the second amplifier element 112, the gate width of the MOSFET that makes up the first amplifier element 111 is the same as the gate width of the MOSFET that makes up the second amplifier element 112.

In the first embodiment and the first modification, the filter circuit 4 is an acoustic wave filter that uses surface acoustic waves; however, the configuration is not limited thereto. The filter circuit 4 may be, for example, an acoustic wave filter that uses boundary acoustic waves, plate waves, or the like.

In the acoustic wave filter, each of the plurality of series arm resonators and the plurality of parallel arm resonators is not limited to an SAW resonator and may be, for example, a BAW (Bulk Acoustic Wave) resonator.

In the first embodiment and the first modification, the radio-frequency circuit 7 includes only a transmitting circuit that includes the power amplifier circuit 1 and the filter circuit 4, and the radio-frequency circuit 7a includes only a transmitting circuit that includes the power amplifier circuit 1a and the filter circuit 4. Alternatively, the radio-frequency circuit 7 or the radio-frequency circuit 7a may include a receiving circuit that includes a low-noise amplifier that amplifies a reception signal that is input from the antenna terminal 72 and a filter circuit connected to the low-noise amplifier. Furthermore, the filter circuit 4 is not limited to a transmission filter and may be a duplexer.

In the first embodiment and the first modification, the first power supply circuit 2 acquires voltage information from the second power supply circuit 3; however, the configuration is not limited thereto. The first power supply circuit 2 may, for example, calculate the average power amplitude of a radio-frequency signal in each predetermined time period and calculate the amplitude of a second power supply voltage V2 according to the calculated average power amplitude.

In the first embodiment and the first modification, the size of the first amplifier element 111 is the same as the size of the second amplifier element 112; however, the configuration is not limited thereto. For example, the size of the first amplifier element 111 may be larger than the size of the second amplifier element 112, and the size of the first amplifier element 111 may be smaller than the size of the second amplifier element 112. When the size of the first amplifier element 111 is larger than the size of the second amplifier element 112, power consumption is reduced. When the size of the first amplifier element 111 is smaller than the size of the second amplifier element 112, the response gets better (gets faster).

Second Embodiment

Hereinafter, a power amplifier circuit 1b and the radio-frequency circuit 7b according to the second embodiment will be described with reference to FIG. 7 and FIG. 8. For the power conversion circuit 1b and the radio-frequency circuit 7b according to the second embodiment, like reference signs denote component elements similar to those of the power conversion circuit 1 and the radio-frequency circuit 7 according to the first embodiment, and the description is omitted.

(1) Configuration of Power Amplifier Circuit and Radio-Frequency Circuit

Figure 7:
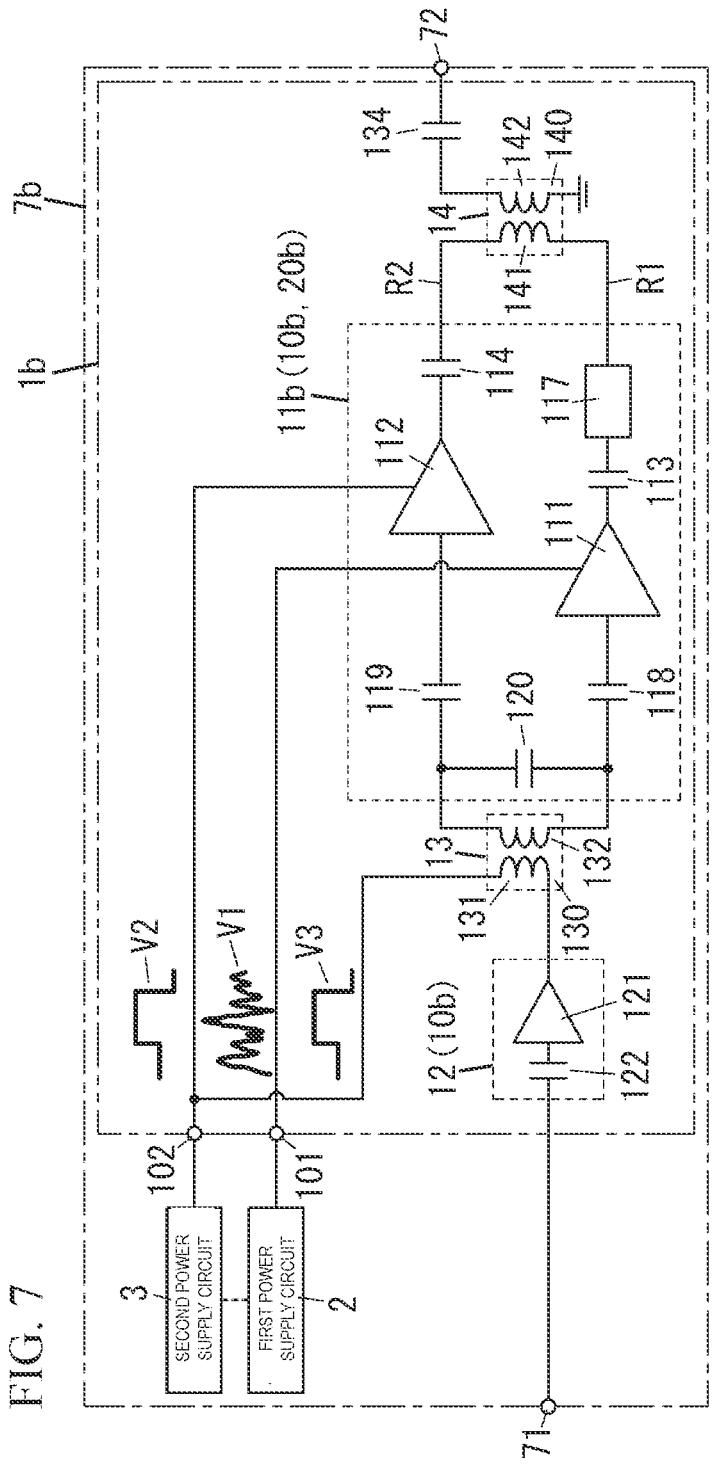
FIG. 7 is a schematic configuration diagram of a power amplifier circuit and a radio-frequency circuit according to a second embodiment.

As shown in FIG. 7, the radio-frequency circuit 7b according to the second embodiment includes the power amplifier circuit 1b, the first power supply circuit 2, the second power supply circuit 3, and the filter circuit 4 (see FIG. 2). The first power supply circuit 2, the second power supply circuit 3, and the filter circuit 4 are similar to those of the radio-frequency circuit 7 according to the above-described first embodiment, and the description is omitted.

As shown in FIG. 7, the power amplifier circuit 1b according to the second embodiment includes the driver-stage amplifier unit 12, a final-stage amplifier unit 11b, the splitter 13, and the synthesis circuit 14.

The driver-stage amplifier unit 12 includes the amplifier element 121 and the capacitor 122. The amplifier element 121 is, for example, an npn-type bipolar transistor. The amplifier element 121 amplifies a radio-frequency signal from the RF signal processing circuit 51 (see FIG. 2) of the signal processing circuit 5.

The amplifier element 121 has a base terminal, a collector terminal, and an emitter terminal. The amplifier element 121 amplifies a radio-frequency signal that is input to the base terminal and outputs the radio-frequency signal from the collector terminal. The emitter terminal is connected to the ground. In other words, the emitter terminal is directly or indirectly connected to the ground. In other words, the emitter terminal is grounded (common-emitter). The collector terminal is electrically connected to the first end of the primary winding 131 of the transformer 130 of the splitter 13. The second end of the primary winding 131 of the transformer 130 is connected to the second power supply circuit 3 via the APT terminal 102. In addition, the base terminal is electrically connected to the signal input terminal 71 via the capacitor 122. The capacitor 122 is a DC-cut capacitor that cuts a DC component that is input to the amplifier element 121.

The final-stage amplifier unit 11b includes the first amplifier element 111 and the second amplifier element 112. The final-stage amplifier unit 11b further includes a plurality of (for example, five) capacitors 113, 114, 118, 119, 120. The final-stage amplifier unit 11b further includes a phase adjustment circuit 117. Each of the first amplifier element 111 and the second amplifier element 112 is, for example, an npn-type bipolar transistor. The first amplifier element 111 is, for example, a class C amplifier. The second amplifier element 112 is, for example, a class AB amplifier.

The first amplifier element (Peaking Amplifier/Aux Amplifier) 111 has a first base terminal, a first collector terminal, and a first emitter terminal. The first amplifier element 111 amplifies a first signal (radio-frequency signal) that is input to the first base terminal and outputs a first amplified signal from the first collector terminal. The first emitter terminal is connected to the ground. In other words, the first emitter terminal is directly or indirectly connected to the ground. In other words, the first emitter terminal is grounded (common-emitter). The first collector terminal is connected to the first power supply circuit 2 via the ET terminal 101, and a first power supply voltage V1 is applied (supplied) to the first collector terminal. The first collector terminal is also connected to the first end of the primary winding 141 of the transformer 140 of the synthesis circuit 14 via the capacitor 113 and the phase adjustment circuit 117. In addition, the first base terminal is connected to the first end of the secondary winding 132 of the transformer 130 of the splitter 13 via the capacitor 118. The capacitor 113 is a DC-cut capacitor that cuts a DC component that is output from the first amplifier element 111. The capacitor 118 is a DC-cut capacitor that cuts a DC component that is input to the first amplifier element 111.

The second amplifier element (Main Amplifier/Carrier Amplifier) 112 has a second base terminal, a second collector terminal, and a second emitter terminal. The second amplifier element 112 amplifies a second signal (radio-frequency signal) that is input to the second base terminal and outputs a second amplified signal from the second collector terminal. The second emitter terminal is connected to the ground. In other words, the second emitter terminal is directly or indirectly connected to the ground. In other words, the second emitter terminal is grounded (common-emitter). The second collector terminal is connected to the second power supply circuit 3 via the APT terminal 102, and a second power supply voltage V2 is applied (supplied) to the second collector terminal. The second collector terminal is also connected to the second end of the primary winding 141 of the transformer 140 via the capacitor 114. In addition, the second base terminal is connected to the second end of the secondary winding 132 of the transformer 130 via the capacitor 119. The capacitor 114 is a DC-cut capacitor that cuts a DC component that is output from the second amplifier element 112. The capacitor 119 is a DC-cut capacitor that cuts a DC component that is input to the second amplifier element 112.

In the power amplifier circuit 1b according to the second embodiment, as shown in FIG. 7, a first signal path R1 through which the first amplified signal passes and a second signal path R2 through which the second amplified signal passes are connected to each other via the primary winding 141 of the transformer 140 of the synthesis circuit 14. In the power amplifier circuit 1b according to the second embodiment, the phase adjustment circuit 117 is provided in the first signal path R1. Therefore, in the power amplifier circuit 1b according to the second embodiment, the first signal path R1 is a specific signal path.

As shown in FIG. 7, the splitter 13 includes the transformer 130. The transformer 130 includes the primary winding 131 and the secondary winding 132. As described above, the first end of the primary winding 131 is connected to the collector terminal of the amplifier element 121. As described above, the second end of the primary winding 131 is connected to the second power supply circuit 3 via the APT terminal 102. As described above, the first end of the secondary winding 132 is connected to the first base terminal of the first amplifier element 111 via the capacitor 118. As described above, the second end of the secondary winding 132 is connected to the second base terminal of the second amplifier element 112 via the capacitor 119. In addition, the capacitor 120 is connected between both ends of the secondary winding 132. The splitter 13 splits a radio-frequency input signal that is input via the driver-stage amplifier unit 12 into a first signal and a second signal. The first signal and the second signal are signals different in phase from each other. As described above, the first signal is input to the first amplifier element 111, and the second signal is input to the second amplifier element 112.

As shown in FIG. 7, the synthesis circuit 14 includes the transformer 140. The transformer 140 includes the primary winding 141 and the secondary winding 142. As described above, the first end of the primary winding 141 is connected to the first collector terminal of the first amplifier element 111 via the capacitor 113 and the phase adjustment circuit 117. As described above, the second end of the primary winding 141 is connected to the second collector terminal of the second amplifier element 112 via the capacitor 114. The first end of the secondary winding 142 is connected to the ground. The second end of the secondary winding 142 is connected to the antenna terminal 72 via the capacitor 134. The capacitor 134 is a DC-cut capacitor that cuts a DC component that is input to the antenna terminal 72. The synthesis circuit 14 synthesizes the first amplified signal that is output from the first amplifier element 111 with the second amplifier element that is output from the second amplifier element 112. Thus, it is possible to further amplify a signal that is input to the antenna terminal 72.

The phase adjustment circuit 117 includes, for example, a λ/4 line. The phase adjustment circuit 117 adjusts the phase of the first amplified signal that passes through the first signal path R1. More specifically, the phase adjustment circuit 117 delays the phase of the first amplified signal by 90°. Here, "λ" is the wave length of each of the radio-frequency signals (the first amplified signal and the second amplified signal) that are respectively output from the first amplifier element 111 and the second amplifier element 112.

(2) Operation of Power Amplifier Circuit

Next, the operation of the power amplifier circuit 1b according to the second embodiment will be described.

(2.1) First Operation

During the first operation of the power amplifier circuit 1b, both the first amplifier element 111 and the second amplifier element 112 are in operation. At this time, the power level of the first signal that is input to the first amplifier element 111 is higher than or equal to a reference power level. The "reference power level" is, for example, defined by a power substantially twice as large as the input power to the second amplifier element 112 when the output power of the first amplifier element 111 is the same as the output power of the second amplifier element 112. The "reference power level" is, for example, defined by, when the input power to the first amplifier element 111 and the second amplifier element 112 are gradually increased, an electric power from when the second amplifier element 112 is saturated to when the first amplifier element 111 starts outputting. In other words, when the power level of the first signal that is input to the first amplifier element 111 becomes higher than or equal to the reference power level, the first amplifier element 111 amplifies the first signal and outputs a first amplified signal. On the other hand, regardless of the power level of the second signal that is input to the second amplifier element 112, the second amplifier element 112 amplifies the second signal and outputs a second amplified signal.

Here, it is assumed that the impedance of the first amplifier element 111 is $Z_1$ and the impedance of the second amplifier element 112 is $Z_2$. It is assumed that the output voltage of each of the first amplifier element 111 and the second amplifier element 112 is $V_0$, a voltage between both ends of the primary winding 141 of the transformer 140 (hereinafter, referred to as "primary voltage") is $V_{11}$, and a voltage between both ends of the secondary winding 142 of the transformer 140 (hereinafter, referred to as "secondary voltage") is $V_{21}$. It is assumed that a current flowing through the primary winding 141 (hereinafter, referred to as "primary current") is $i_{11}$ and a current flowing through the secondary winding 142 (hereinafter, referred to as "secondary current") is $i_{21}$. The turn ratio of the primary winding 141 to the secondary winding 142 is assumed as 1:m.

Here, since the phase of the first amplified signal (voltage signal) that is output from the first amplifier element 111 and the phase of the second amplified signal (voltage signal) that is output from the second amplifier element 112 are opposite, the primary voltage $V_{11}$ that is applied to the primary winding 141 is expressed as the expression (1).

[Equation 1]

$$V_{11}=2\times V_0 \tag{1}$$

Therefore, the secondary voltage $V_{21}$ applied to the secondary winding 142 is expressed as the expression (2).

[Equation 2]

$$V_{21}=m\times V_{11}=2\times m\times V_0 \tag{2}$$

The secondary current $i_{21}$ flowing through the secondary winding 142 is expressed as the expression (3).

[Equation 3]

$$i_{21} = \frac{1}{m}\times i_{11} \tag{3}$$

Here, when the resistance value of a load connected to the secondary winding 142 is $R_L$, the resistance value $R_L$ is expressed as the expression (4).

[Equation 4]

$$R_L = \frac{V_{21}}{i_{21}} = \frac{2 \times m \times V_0}{\frac{1}{m} \times i_{11}} = \frac{2 \times m^2 \times V_0}{i_{11}} \quad (4)$$

Therefore, during the first operation, each of the impedance $Z_1$ of the first amplifier element 111 and the impedance $Z_2$ of the second amplifier element 112 is expressed as the expression (5).

[Equation 5]

$$Z_1 = Z_2 = \frac{V_0}{i_{11}} = V_0 \times \frac{R_L}{2 \times m^2 \times V_0} = \frac{R_L}{2 \times m^2} \quad (5)$$

During the first operation, each of the impedance $Z_1$ of the first amplifier element 111 and the impedance $Z_2$ of the second amplifier element 112 is low and is, for example, 5Ω to 10Ω.

(2.2) Second Operation

During the second operation of the power amplifier circuit 1b, the input power to the first amplifier element 111 reduces, and the output power of the first amplifier element 111 approaches zero. In the power amplifier circuit 1b according to the second embodiment, since the λ/4 line (phase adjustment circuit 117) is provided in the first signal path R1 to which the first amplifier element 111 is connected, the first end of the primary winding 141 of the transformer 140 is short-circuited. At this time, since the impedance $Z_1$ of the first amplifier element 111 is constantly large, the first amplifier element 111 is in a state of being isolated from the first signal path R1.

At this time, the primary voltage $V_{11}$ that is applied to the primary winding 141 is expressed as the expression (6).

[Equation 6]

$$V_{11} = V_0 \quad (6)$$

Therefore, the secondary voltage $V_{21}$ that is applied to the secondary winding 142 is expressed as the expression (7).

[Equation 7]

$$V_{21} = m \times V_{11} = m \times V_0 \quad (7)$$

The secondary current $i_{21}$ is the same as in the case during the first operation, so the resistance value $R_L$ of a load connected to the secondary winding 142 is expressed as the expression (8).

[Equation 8]

$$R_L = \frac{V_{21}}{i_{21}} = \frac{m \times V_0}{\frac{1}{m} \times i_{11}} = \frac{m^2 \times V_0}{i_{11}} \quad (8)$$

Therefore, during the second operation, the impedance $Z_2$ of the second amplifier element 112 is expressed as the expression (9).

[Equation 9]

$$Z_2 = \frac{V_0}{i_{11}} = V_0 \times \frac{R_L}{m^2 \times V_0} = \frac{R_L}{m^2} \quad (9)$$

In short, the impedance $Z_2$ of the second amplifier element 112 during the second operation is twice as large as the impedance $Z_2$ of the second amplifier element 112 during the first operation from the expression (5) and the expression (9). Therefore, during the second operation, it is possible to improve the amplification efficiency of the power amplifier circuit 1b as compared to during the first operation. In other words, with the power amplifier circuit 1b according to the second embodiment, a decrease in amplification efficiency is suppressed.

Figure 8:
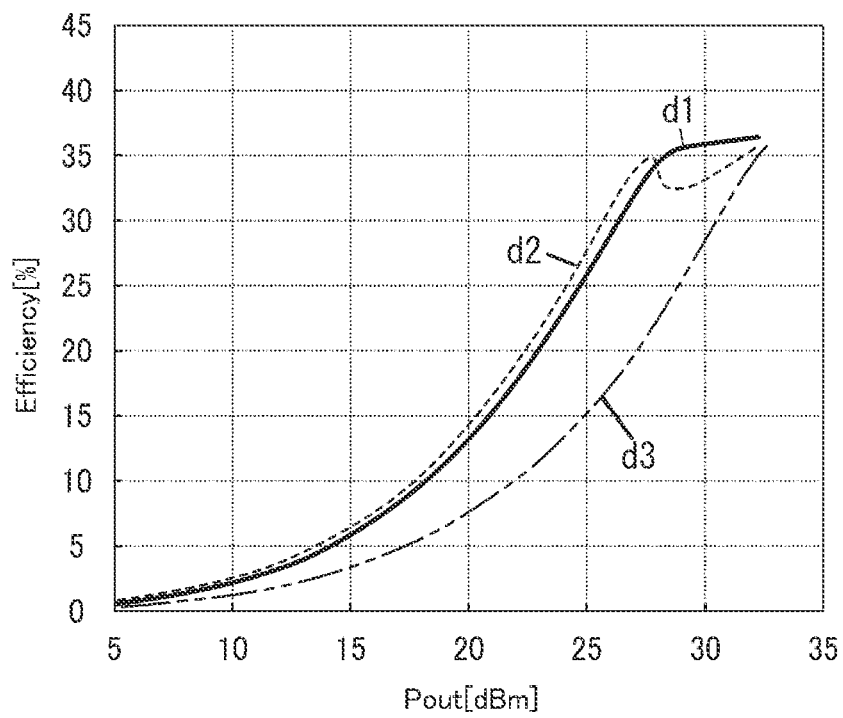
FIG. 8 relates to the above same power conversion circuit and is a characteristic curve showing the relationship between output power and amplification efficiency.

FIG. 8 is a characteristic curve showing the relationship between the output power of each power amplifier circuit and amplification efficiency. In FIG. 8, the continuous line d1 represents the characteristics of the power amplifier circuit 1b according to the second embodiment. In FIG. 8, the dashed line d2 represents the characteristics of a Doherty amplifier circuit according to a comparative example. In FIG. 8, the alternate long and short dashed line d3 represents the characteristics in the case where both the first amplifier element 111 and the second amplifier element 112 are operated by the first power supply circuit 2.

In the power amplifier circuit 1b according to the second embodiment, as shown in FIG. 8, it is possible to improve the amplification efficiency over all the range of output power (the range higher than or equal to 0 dBm and lower than or equal to 33 dBm) as compared to the case where both the first amplifier element 111 and the second amplifier element 112 are operated by the first power supply circuit 2. In the power amplifier circuit 1b according to the second embodiment, it is possible to improve the amplification efficiency in the range in which the output power is higher than or equal to 28 dBm as compared to the Doherty amplifier circuit according to the comparative example. On the other hand, in the power amplifier circuit 1b according to the second embodiment, the amplification efficiency is slightly lower in the range in which the output power is lower than 28 dBm as compared to the Doherty amplifier circuit according to the comparative example.

In the power amplifier circuit 1b according to the second embodiment, the phase adjustment circuit 117 is provided in the first signal path R1; however, the configuration is not limited thereto. The phase adjustment circuit 117 may be provided in, for example, the second signal path R2. In other words, the second signal path R2 may be a specific signal path.

Third Embodiment

Hereinafter, a power amplifier circuit 1c and the radio-frequency circuit 7c according to the third embodiment will be described with reference to FIG. 9. For the power conversion circuit 1c and the radio-frequency circuit 7c according to the third embodiment, like reference signs denote component elements similar to those of the power conversion circuit 1 and the radio-frequency circuit 7 according to the first embodiment, and the description is omitted.

(1) Configuration of Power Amplifier Circuit and Radio-Frequency Circuit

Figure 9:
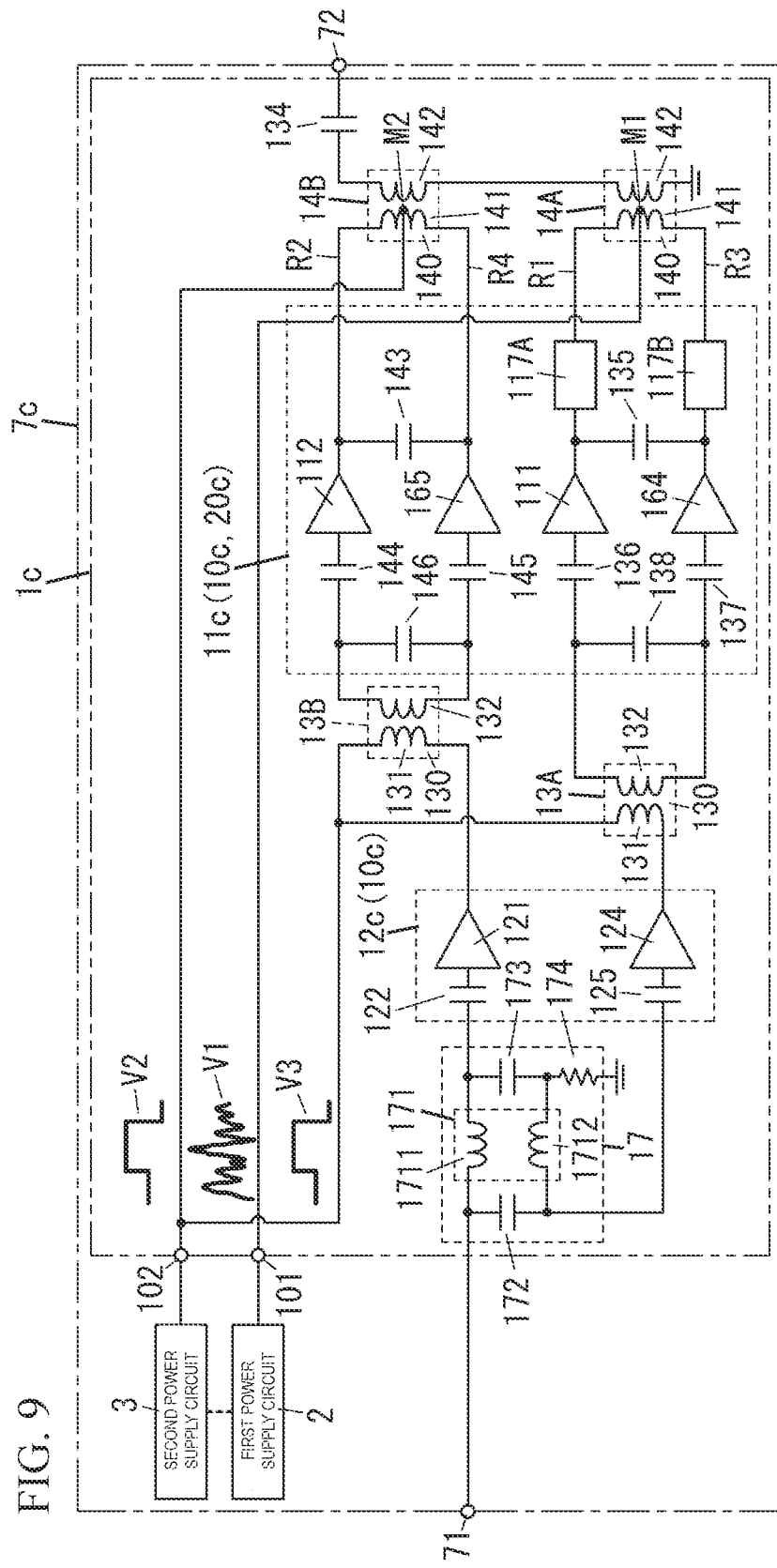
FIG. 9 is a schematic configuration diagram of a power amplifier circuit and a radio-frequency circuit according to a third embodiment.

As shown in FIG. 9, the radio-frequency circuit 7c according to the third embodiment includes the power amplifier circuit 1c, the first power supply circuit 2, the second power supply circuit 3, and the filter circuit 4 (see FIG. 2). The first power supply circuit 2, the second power supply circuit 3, and the filter circuit 4 are similar to those of the radio-frequency circuit 7 according to the above-described first embodiment, and the description is omitted.

As shown in FIG. 9, the power amplifier circuit 1c according to the third embodiment includes a driver-stage amplifier unit 12c, a final-stage amplifier unit 11c, a plurality of (for example, two) splitters 13A, 13B, and a plurality of (for example, two) synthesis circuits 14A, 14B. The power amplifier circuit 1c according to the third embodiment further includes a splitter 17. In the following description, when the plurality of splitters 13A, 13B is described separately, the plurality of splitters 13A, 13B may be respectively referred to as the first splitter 13A and the second splitter 13B. In the following description, when the plurality of synthesis circuits 14A, 14B is described separately, the plurality of synthesis circuits 14A, 14B may be respectively referred to as the first synthesis circuit 14A and the second synthesis circuit 14B.

The driver-stage amplifier unit 12c includes a plurality of (for example, two) amplifier elements 121, 124 and a plurality of (for example, two) capacitors 122, 125. Each of the plurality of amplifier elements 121, 124 is, for example, an npn-type bipolar transistor. Each of the plurality of amplifier elements 121, 124 amplifies a radio-frequency signal from the RF signal processing circuit 51 (see FIG. 2) of the signal processing circuit 5.

Each of the plurality of amplifier elements 121, 124 has a base terminal, a collector terminal, and an emitter terminal. Each of the plurality of amplifier elements 121, 124 amplifies a radio-frequency signal that is input to the base terminal and outputs the radio-frequency signal from the collector terminal. The emitter terminal of each of the plurality of amplifier elements 121, 124 is connected to the ground. In other words, the emitter terminal of each of the plurality of amplifier elements 121, 124 is directly or indirectly connected to the ground. In other words, the emitter terminal of each of the plurality of amplifier elements 121, 124 is grounded (common-emitter). The collector terminal of the amplifier element 121 is connected to the first end of the primary winding 131 of the transformer 130 of the second splitter 13B. The second end of the primary winding 131 of the transformer 130 of the second splitter 13B is connected to the second power supply circuit 3 via the APT terminal 102. In addition, the base terminal of the amplifier element 121 is connected to the signal input terminal 71 via the capacitor 122 and a primary winding 1711 of a transformer 171 of the splitter 17. The collector terminal of the amplifier element 124 is connected to the first end of the primary winding 131 of the transformer 130 of the first splitter 13A. The second end of the primary winding 131 of the transformer 130 of the first splitter 13A is connected to the second power supply circuit 3 via the APT terminal 102. In addition, the base terminal of the amplifier element 124 is connected to the signal input terminal 71 via the capacitor 125 and a capacitor 172 of the splitter 17. The capacitor 122 is a DC-cut capacitor that cuts a DC component that is input to the amplifier element 121. The capacitor 125 is a DC-cut capacitor that cuts a DC component that is input to the amplifier element 124.

The final-stage amplifier unit 11c includes the first amplifier element 111 and the second amplifier element 112. The final-stage amplifier unit 11c includes a third amplifier element 164 and a fourth amplifier element 165. The final-stage amplifier unit 11c further includes a plurality of (for example, eight) capacitors 135, 136, 137, 138, 143, 144, 145, 146. The final-stage amplifier unit 11c further includes a plurality of (for example, two) phase adjustment circuits 117A, 117B. Each of the first amplifier element 111, the second amplifier element 112, the third amplifier element 164, and the fourth amplifier element 165 is, for example, an npn-type bipolar transistor. Each of the first amplifier element 111 and the third amplifier element 164 is, for example, a class C amplifier. Each of the second amplifier element 112 and the fourth amplifier element 165 is, for example, a class AB amplifier. In the following description, when the plurality of phase adjustment circuits 117A, 117B is described separately, the plurality of phase adjustment circuits 117A, 117B may be respectively referred to as the first phase adjustment circuit 117A and the second phase adjustment circuit 117B.

The first amplifier element 111 has a first base terminal, a first collector terminal, and a first emitter terminal. The first amplifier element 111 amplifies a first signal (radio-frequency signal) that is input to the first base terminal and outputs a first amplified signal from the first collector terminal. The first emitter terminal is connected to the ground. In other words, the first emitter terminal is directly or indirectly connected to the ground. In other words, the first emitter terminal is grounded (common-emitter). The first collector terminal is also connected to the first end of the primary winding 141 of the transformer 140 of the first synthesis circuit 14A via the first phase adjustment circuit 117A. In addition, the first base terminal is connected to the first end of the secondary winding 132 of the transformer 130 of the first splitter 13A via the capacitor 136. The capacitor 136 is a DC-cut capacitor that cuts a DC component that is input to the first amplifier element 111.

The second amplifier element 112 has a second base terminal, a second collector terminal, and a second emitter terminal. The second amplifier element 112 amplifies a second signal (radio-frequency signal) that is input to the second base terminal and outputs a second amplified signal from the second collector terminal. The second emitter terminal is connected to the ground. In other words, the second emitter terminal is directly or indirectly connected to the ground. In other words, the second emitter terminal is grounded (common-emitter). The second collector terminal is also connected to the first end of the primary winding 141 of the transformer 140 of the second synthesis circuit 14B. In addition, the second base terminal is connected to the first end of the secondary winding 132 of the transformer 130 of the second splitter 13B via the capacitor 144. The capacitor 144 is a DC-cut capacitor that cuts a DC component that is input to the second amplifier element 112.

The third amplifier element 164 has a third base terminal, a third collector terminal, and a third emitter terminal. The third amplifier element 164 amplifies a third signal (radio-frequency signal) that is input to the third base terminal and outputs a third amplified signal from the third collector terminal. The third emitter terminal is connected to the ground. In other words, the third emitter terminal is directly or indirectly connected to the ground. In other words, the third emitter terminal is grounded (common-emitter). The third collector terminal is also connected to the second end of the primary winding 141 of the transformer 140 of the first synthesis circuit 14A via the second phase adjustment circuit 117B. In addition, the third base terminal is connected to the second end of the secondary winding 132 of the transformer 130 of the first splitter 13A via the capacitor 137. The capacitor 137 is a DC-cut capacitor that cuts a DC component that is input to the third amplifier element 164. In the power amplifier circuit 1c according to the third embodiment, the third amplifier element 164 is connected in parallel with the first amplifier element 111. The capacitor 135 is connected between the first collector terminal of the first amplifier element 111 and the third collector terminal of the third amplifier element 164.

The fourth amplifier element 165 has a fourth base terminal, a fourth collector terminal, and a fourth emitter terminal. The fourth amplifier element 165 amplifies a fourth signal (radio-frequency signal) that is input to the fourth base terminal and outputs a fourth amplified signal from the fourth collector terminal. The fourth emitter terminal is connected to the ground. In other words, the fourth emitter terminal is directly or indirectly connected to the ground. In other words, the fourth emitter terminal is grounded (common-emitter). The fourth collector terminal is also connected to the second end of the primary winding 141 of the transformer 140 of the second synthesis circuit 14B. In addition, the fourth base terminal is connected to the second end of the secondary winding 132 of the transformer 130 of the second splitter 13B via the capacitor 145. The capacitor 145 is a DC-cut capacitor that cuts a DC component that is input to the fourth amplifier element 165. In the power amplifier circuit 1c according to the third embodiment, the fourth amplifier element 165 is connected in parallel with the second amplifier element 112. The capacitor 143 is connected between the second collector terminal of the second amplifier element 112 and the fourth collector terminal of the fourth amplifier element 165.

In the power amplifier circuit 1c according to the third embodiment, as shown in FIG. 9, a first signal path R1 through which the first amplified signal passes and a third signal path R3 through which the third amplified signal passes are connected to each other via the primary winding 141 of the transformer 140 of the first synthesis circuit 14A. In the power amplifier circuit 1c according to the third embodiment, as shown in FIG. 9, a second signal path R2 through which the second amplified signal passes and a fourth signal path R4 through which the fourth amplified signal passes are connected to each other via the primary winding 141 of the transformer 140 of the second synthesis circuit 14B. In the power amplifier circuit 1c according to the third embodiment, the first phase adjustment circuit 117A is provided in the first signal path R1. In the power amplifier circuit 1c according to the third embodiment, the second phase adjustment circuit 117B is provided in the third signal path R3. Therefore, in the power amplifier circuit 1c according to the third embodiment, the first signal path R1 is a first specific signal path, and the third signal path R3 is a second specific signal path.

Here, in the power amplifier circuit 1c according to the third embodiment, the two amplifier elements 121, 124 that make up the driver-stage amplifier unit 12c are connected in parallel with each other. Therefore, it is assumed that the first amplifier element 111 and the second amplifier element 112 respectively connected to the two amplifier elements 121, 124 via the first splitter 13A and the second splitter 13B are also connected in parallel with each other. The same applies to the third amplifier element 164 and the fourth amplifier element 165 respectively connected to the two amplifier elements 121, 124 via the first splitter 13A and the second splitter 13B are also connected in parallel with each other.

As shown in FIG. 9, the first splitter 13A includes the transformer 130. The transformer 130 includes the primary winding 131 and the secondary winding 132. As described above, the first end of the primary winding 131 is connected to the collector terminal of the amplifier element 124. As described above, the second end of the primary winding 131 is connected to the second power supply circuit 3 via the APT terminal 102. As described above, the first end of the secondary winding 132 is connected to the third base terminal of the third amplifier element 164 via the capacitor 137. As described above, the second end of the secondary winding 132 is connected to the first base terminal of the first amplifier element 111 via the capacitor 136. In addition, the capacitor 138 is connected between both ends of the secondary winding 132. The first splitter 13A splits a radio-frequency first input signal that is input via the amplifier element 124 of the driver-stage amplifier unit 12c into a first signal and a third signal. The first signal and the third signal are signals different in phase from each other. As described above, the first signal is input to the first amplifier element 111, and the third signal is input to the third amplifier element 164.

As shown in FIG. 9, the second splitter 13B includes the transformer 130. The transformer 130 includes the primary winding 131 and the secondary winding 132. As described above, the first end of the primary winding 131 is connected to the collector terminal of the amplifier element 121. As described above, the second end of the primary winding 131 is connected to the second power supply circuit 3 via the APT terminal 102. As described above, the first end of the secondary winding 132 is connected to the fourth base terminal of the fourth amplifier element 165 via the capacitor 145. As described above, the second end of the secondary winding 132 is connected to the second base terminal of the second amplifier element 112 via the capacitor 144. In addition, the capacitor 146 is connected between both ends of the secondary winding 132. The second splitter 13B splits a radio-frequency second input signal that is input via the amplifier element 121 of the driver-stage amplifier unit 12c into a second signal and a fourth signal. The second signal and the fourth signal are signals different in phase from each other. As described above, the second signal is input to the second amplifier element 112, and the fourth signal is input to the fourth amplifier element 165.

As shown in FIG. 9, the first synthesis circuit 14A includes the transformer 140. The transformer 140 includes the primary winding 141 and the secondary winding 142. As described above, the first end (the third signal path R3-side end portion) of the primary winding 141 is connected to the third collector terminal of the third amplifier element 164 via the second phase adjustment circuit 117B. As described above, the second end (the first signal path R1-side end portion) of the primary winding 141 is connected to the first collector terminal of the first amplifier element 111 via the first phase adjustment circuit 117A. The first end of the secondary winding 142 is connected to the ground. The second end of the secondary winding 142 is connected to the first end of the primary winding 141 of the transformer 140 of the second synthesis circuit 14B. A middle point M1 of the primary winding 141 is connected to the first power supply circuit 2 via the ET terminal 101. The first synthesis circuit 14A synthesizes the first amplified signal that is output from the first amplifier element 111 with the third amplifier element that is output from the third amplifier element 164. Thus, it is possible to further amplify a signal that is output toward the antenna terminal 72.

As shown in FIG. 9, the second synthesis circuit 14B includes the transformer 140. The transformer 140 includes the primary winding 141 and the secondary winding 142. As described above, the first end (the fourth signal path R4-side end portion) of the primary winding 141 is connected to the fourth collector terminal of the fourth amplifier element 165. As described above, the second end (the second signal path R2-side end portion) of the primary winding 141 is connected to the second collector terminal of the second amplifier element 112. As described above, the first end of the secondary winding 142 is connected to the second end of the secondary winding 142 of the transformer 140 of the first synthesis circuit 14A. The second end of the secondary winding 142 is connected to the antenna terminal 72 via the capacitor 134. The capacitor 134 is a DC-cut capacitor that cuts a DC component that is input to the antenna terminal 72. A middle point M2 of the primary winding 141 is connected to the second power supply circuit 3 via the APT terminal 102. The second synthesis circuit 14B synthesizes the second amplified signal that is output from the second amplifier element 112 with the fourth amplifier element that is output from the fourth amplifier element 165. Thus, it is possible to further amplify a signal that is output toward the antenna terminal 72.

The first phase adjustment circuit 117A includes, for example, a λ/4 line. The first phase adjustment circuit 117A adjusts the phase of the first amplified signal that passes through the first signal path R1. More specifically, the first phase adjustment circuit 117A delays the phase of the first amplified signal by 90°.

The second phase adjustment circuit 117B includes, for example, a λ/4 line. The second phase adjustment circuit 117B adjusts the phase of the third amplified signal that passes through the third signal path R3. More specifically, the second phase adjustment circuit 117B delays the phase of the third amplified signal by 90°.

The splitter 17 includes the transformer 171, a plurality of (for example, two) capacitors 172, 173, and a resistor 174. The transformer 171 includes the primary winding 1711 and a secondary winding 1712. The first end of the primary winding 1711 is connected to the signal input terminal 71. The second end of the primary winding 1711 is connected to the base terminal of the amplifier element 121 via the capacitor 122. The first end of the secondary winding 1712 is connected to a junction point between the capacitor 125 and the capacitor 172. The second end of the secondary winding 1712 is connected to a junction point between the capacitor 173 and the resistor 174. The capacitor 173 and the resistor 174 are connected in series with each other between the ground and a junction point between the primary winding 1711 and the capacitor 122. The splitter 17 splits a signal that is input via the signal input terminal 71 into two signals different in phase from each other and inputs the signals to the driver-stage amplifier unit 12c.

(2) Operation of Power Amplifier Circuit

Next, the operation of the power amplifier circuit 1c according to the third embodiment will be described.

(2.1) First Operation

During the first operation of the power amplifier circuit 1c, all the first amplifier element 111, the second amplifier element 112, the third amplifier element 164, and the fourth amplifier element 165 are in operation. At this time, the power level of the first signal that is input to the first amplifier element 111 and the power level of the third signal that is input to the third amplifier element 164 are higher than or equal to a reference power level. In other words, when the power level of the first signal that is input to the first amplifier element 111 becomes higher than or equal to the reference power level, the first amplifier element 111 amplifies the first signal and outputs a first amplified signal. When the power level of the third signal that is input to the third amplifier element 164 becomes higher than or equal to the reference power level, the third amplifier element 164 amplifies the third signal and outputs a third amplified signal. On the other hand, regardless of the power level of the second signal that is input to the second amplifier element 112, the second amplifier element 112 amplifies the second signal and outputs a second amplified signal. Regardless of the power level of the fourth signal that is input to the fourth amplifier element 165, the fourth amplifier element 165 amplifies the fourth signal and outputs a fourth amplified signal.

Here, it is assumed that the impedance of the first amplifier element 111 is $Z_1$, the impedance of the second amplifier element 112 is $Z_2$, the impedance of the third amplifier element 164 is $Z_3$, and the impedance of the fourth amplifier element 165 is $Z_4$. It is assumed that the output voltage of each of the first amplifier element 111, the second amplifier element 112, the third amplifier element 164, and the fourth amplifier element 165 is $V_0$, a voltage between both ends of the primary winding 141 of the transformer 140 of each of the first synthesis circuit 14A and the second synthesis circuit 14B (hereinafter, referred to as "primary voltage") is $V_{11}$, and a voltage between both ends of the secondary winding 142 of the transformer 140 of each of the first synthesis circuit 14A and the second synthesis circuit 14B (hereinafter, referred to as "secondary voltage") is $V_{21}$. It is assumed that a current flowing through the primary winding 141 of each of the first synthesis circuit 14A and the second synthesis circuit 14B (hereinafter, referred to as "primary current") is $i_{11}$ and a current flowing through the secondary winding 142 of each of the first synthesis circuit 14A and the second synthesis circuit 14B (hereinafter, referred to as "secondary current") is $i_{21}$. In each of the first synthesis circuit 14A and the second synthesis circuit 14B, the turn ratio of the primary winding 141 to the secondary winding 142 is assumed as 1:m.

Here, the phase of the first amplified signal (voltage signal) that is output from the first amplifier element 111 and the phase of the third amplified signal (voltage signal) that is output from the third amplifier element 164 are opposite. The phase of the second amplified signal (voltage signal) that is output from the second amplifier element 112 and the phase of the fourth amplified signal (voltage signal) that is output from the fourth amplifier element 165 are opposite. Therefore, the primary voltage $V_{11}$ that is applied to the primary winding 141 of the transformer 140 of each of the first synthesis circuit 14A and the second synthesis circuit 14B is expressed as the expression (10).

[Equation 10]

$$V_{11}=2\times V_0 \tag{10}$$

Therefore, the secondary voltage $V_{21}$ that is applied to the secondary winding 142 of the transformer 140 of each of the first synthesis circuit 14A and the second synthesis circuit 14B is expressed as the expression (11).

[Equation 11]

$$V_{21}=m\times V_{11}=2\times V_0 \tag{11}$$

The secondary current $i_{21}$ flowing through the secondary winding 142 of the transformer 140 of each of the first synthesis circuit 14A and the second synthesis circuit 14B is expressed as the expression (12).

[Equation 12]

$$i_{21} = \frac{1}{m} \times i_{11} \quad (12)$$

Here, when the resistance value of a load connected to the secondary winding 142 of the first synthesis circuit 14A and the secondary winding 142 of the second synthesis circuit 14B, connected in series with each other, is $R_L$, the resistance value $R_L$ is expressed as the expression (13).

[Equation 13]

$$R_L = \frac{V_{21} + V_{21}}{i_{21}} = \frac{2 \times m \times V_0 + 2 \times m \times V_0}{\frac{1}{m} \times i_{11}} = \frac{4 \times m^2 \times V_0}{i_{11}} \quad (13)$$

Therefore, during the first operation, each of the impedance $Z_2$ of the second amplifier element 112 and the impedance $Z_4$ of the fourth amplifier element 165 is expressed as the expression (14).

[Equation 14]

$$Z_2 = Z_4 = \frac{V_0}{i_{11}} = V_0 \times \frac{R_L}{4 \times m^2 \times V_0} = \frac{R_L}{4 \times m^2} \quad (14)$$

During the first operation, each of the impedance $Z_2$ of the second amplifier element 112 and the impedance $Z_4$ of the fourth amplifier element 165 is low and is, for example, 5Ω to 10Ω.

(2.2) Second Operation

During the second operation of the power amplifier circuit 1c, the input power to the first amplifier element 111 and the third amplifier element 164 reduces, and the output power of the first amplifier element 111 and the third amplifier element 164 approaches zero. In the power amplifier circuit 1c according to the third embodiment, since the λ/4 line (first phase adjustment circuit 117A) is provided in the first signal path R1 to which the first amplifier element 111 is connected and the λ/4 line (second phase adjustment circuit 117B) is provided in the third signal path R3 to which the third amplifier element 164 is connected, both ends of the primary winding 141 of the transformer 140 of the first synthesis circuit 14A are short-circuited. At this time, since the impedance $Z_1$ of the first amplifier element 111 is constantly large, the first amplifier element 111 is in a state of being isolated from the first signal path R1. Since the impedance Z3 of the third amplifier element 164 is constantly large, the third amplifier element 164 is in a state of being isolated from the third signal path R3.

At this time, the primary voltage $V_{11}$ that is applied to the primary winding 141 of the transformer 140 of the second synthesis circuit 14B is expressed as the expression (15).

[Equation 15]

$$V_{11} = 2 \times V_0 \quad (15)$$

Therefore, the secondary voltage $V_{21}$ that is applied to the secondary winding 142 of the transformer 140 of the second synthesis circuit 14B is expressed as the expression (16).

[Equation 16]

$$V_{21} = m \times V_{11} = 2 \times m \times V_0 \quad (16)$$

The secondary current $i_{21}$ flowing through the secondary winding 142 of the transformer 140 of the second synthesis circuit 14B is the same as in the case during the first operation, so the resistance value $R_L$ of a load connected to the secondary winding 142 is expressed as the expression (17).

[Equation 17]

$$R_L = \frac{V_{21}}{i_{21}} = \frac{2 \times m \times V_0}{\frac{1}{m} \times i_{11}} = \frac{2 \times m^2 \times V_0}{i_{11}} \quad (17)$$

Therefore, during the second operation, each of the impedance $Z_2$ of the second amplifier element 112 and the impedance $Z_4$ of the fourth amplifier element 165 is expressed as the expression (18).

[Equation 18]

$$Z_2 = Z_4 = \frac{V_0}{i_{11}} = V_0 \times \frac{R_L}{2 \times m^2 \times V_0} = \frac{R_L}{2 \times m^2} \quad (18)$$

In short, the impedance $Z_2$ of the second amplifier element 112 during the second operation is twice as large as the impedance $Z_2$ of the second amplifier element 112 during the first operation from the expression (14) and the expression (18). The impedance $Z_4$ of the fourth amplifier element 165 during the second operation is twice as large as the impedance $Z_4$ of the fourth amplifier element 165 during the first operation from the expression (14) and the expression (18). Therefore, during the second operation, it is possible to improve the amplification efficiency of the power amplifier circuit 1c as compared to during the first operation. In other words, with the power amplifier circuit 1c according to the third embodiment, a decrease in amplification efficiency is suppressed.

In the power amplifier circuit 1c according to the third embodiment, the first phase adjustment circuit 117A is provided in the first signal path R1; however, the configuration is not limited thereto. The first phase adjustment circuit 117A may be provided in, for example, the second signal path R2. In other words, the second signal path R2 may be a first specific signal path. In the power amplifier circuit 1c according to the third embodiment, the second phase adjustment circuit 117B is provided in the third signal path R3; however, the configuration is not limited thereto. The second phase adjustment circuit 117B may be provided in, for example, the fourth signal path R4. In other words, the fourth signal path R4 may be a second specific signal path.

Fourth Embodiment

Hereinafter, a power amplifier circuit 1d and the radio-frequency circuit 7d according to the fourth embodiment will be described with reference to FIG. 10. For the power conversion circuit 1d and the radio-frequency circuit 7d according to the fourth embodiment, like reference signs denote component elements similar to those of the power conversion circuit 1 and the radio-frequency circuit 7 according to the first embodiment, and the description is omitted.

Figure 10:
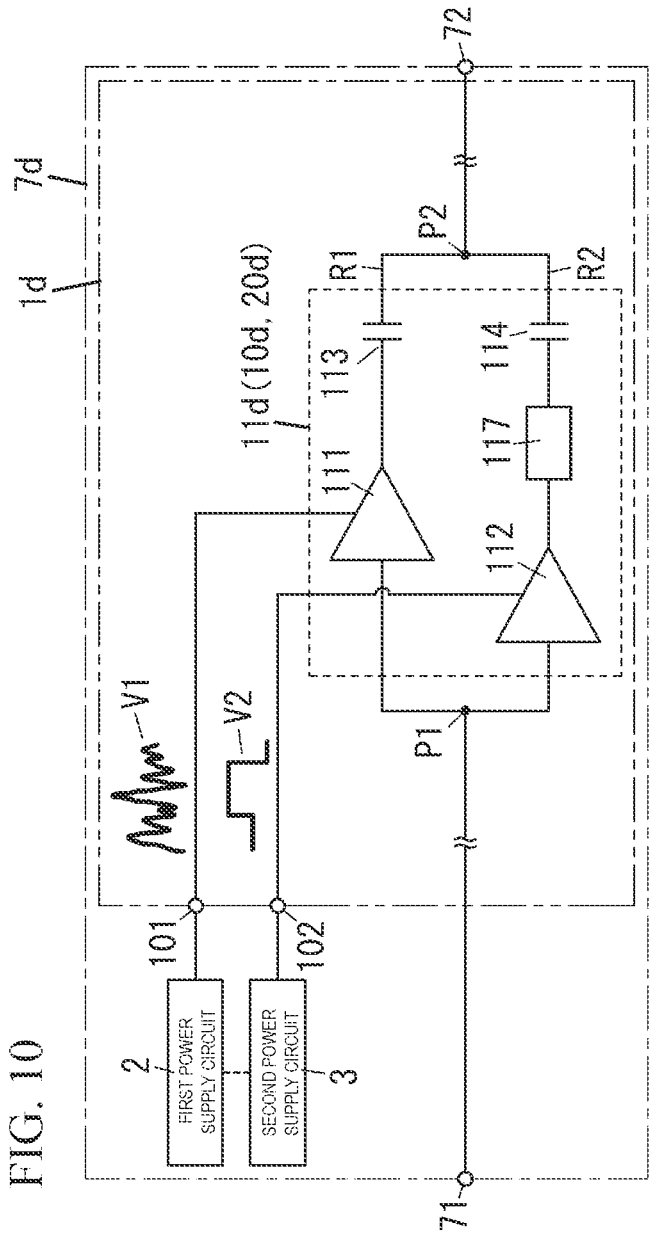
FIG. 10 is a schematic configuration diagram of a power amplifier circuit and a radio-frequency circuit according to a fourth embodiment.

As shown in FIG. 10, the radio-frequency circuit 7d according to the fourth embodiment includes the power amplifier circuit 1d, the first power supply circuit 2, the second power supply circuit 3, and the filter circuit 4 (see FIG. 2). The first power supply circuit 2, the second power supply circuit 3, and the filter circuit 4 are similar to those of the radio-frequency circuit 7 according to the above-described first embodiment, and the description is omitted.

As shown in FIG. 10, the power amplifier circuit 1d according to the fourth embodiment includes the driver-stage amplifier unit 12 (see FIG. 1), a final-stage amplifier unit 11d, and the output matching circuit 15 (see FIG. 1). The driver-stage amplifier unit 12 and the output matching circuit 15 are similar to those of the power amplifier circuit 1 according to the above-described first embodiment, so the description is omitted.

The final-stage amplifier unit 11d includes the first amplifier element 111 and the second amplifier element 112. The final-stage amplifier unit 11d further includes a plurality of (for example, two) capacitors 113, 114. The final-stage amplifier unit 11d further includes the phase adjustment circuit 117. Each of the first amplifier element 111 and the second amplifier element 112 is, for example, an npn-type bipolar transistor.

The first amplifier element 111 has a first base terminal, a first collector terminal, and a first emitter terminal. The first amplifier element 111 amplifies a first signal (radio-frequency signal) that is input to the first base terminal and outputs a first amplified signal from the first collector terminal. The first emitter terminal is connected to the ground. In other words, the first emitter terminal is directly or indirectly connected to the ground. In other words, the first emitter terminal is grounded (common-emitter). The first collector terminal is connected to the first power supply circuit 2 via the ET terminal 101, and a first power supply voltage V1 is applied (supplied) to the first collector terminal. The first collector terminal is connected to a second junction point P2 via the capacitor 113. In addition, the first base terminal is connected to a first junction point P1.

The second amplifier element 112 has a second base terminal, a second collector terminal, and a second emitter terminal. The second amplifier element 112 amplifies a second signal (radio-frequency signal) that is input to the second base terminal and outputs a second amplified signal from the second collector terminal. The second emitter terminal is connected to the ground. In other words, the second emitter terminal is directly or indirectly connected to the ground. In other words, the second emitter terminal is grounded (common-emitter). The second collector terminal is connected to the second power supply circuit 3 via the APT terminal 102, and a second power supply voltage V2 is applied (supplied) to the second collector terminal. The second collector terminal is connected to the second junction point P2 via the phase adjustment circuit 117 and the capacitor 114. In addition, the second base terminal is connected to the first junction point P1. In other words, the first base terminal of the first amplifier element 111 and the second base terminal of the second amplifier element 112 are connected to each other at the first junction point P1. The second junction point P2 is a point at which the first signal path R1 through which the first amplified signal that is output from the first amplifier element 111 passes and the second signal path R2 through which the second amplified signal that is output from the second amplifier element 112 passes are connected. In the power amplifier circuit 1d according to the fourth embodiment, the phase adjustment circuit 117 is provided in the second signal path R2, and the second signal path R2 is a specific signal path.

The phase adjustment circuit 117 includes, for example, a $\lambda/4$ line. The phase adjustment circuit 117 adjusts the phase of the second amplified signal that passes through the second signal path R2. More specifically, the phase adjustment circuit 117 delays the phase of the second amplified signal by 90°.

In the power amplifier circuit 1d according to the fourth embodiment, the input signal input to the power amplifier circuit 1d is split into a first signal and a second signal by way of the first junction point P1. Therefore, the first signal and the second signal are the same signal. The phrase "the first signal and the second signal are the same" means that at least the phase of the first signal and the phase of the second signal are the same. The phrase "the phase of the first signal and the phase of the second signal are the same" includes not only the case where the phase of the first signal and the phase of the second signal are strictly the same but also the case where the phase of the second signal falls within the range of ±5% with respect to the phase of the first signal.

In the power amplifier circuit 1d according to the fourth embodiment, the first amplified signal that passes through the first signal path R1 and the second amplified signal that passes through the second signal path R2 are synthesized at the second junction point P2. In the power amplifier circuit 1d according to the fourth embodiment, the second amplified signal that is output from the second amplifier element 112 passes through the phase adjustment circuit 117, so the phase of the second amplified signal is delayed by 90° from the phase of the first amplified signal.

In the power amplifier circuit 1d according to the fourth embodiment as well, the impedance of the second amplifier element 112 during the second operation in which only the second amplifier element 112 is in operation is able to be made higher than the impedance of the second amplifier element 112 during the first operation in which both the first amplifier element 111 and the second amplifier element 112 are in operation. Thus, during the second operation, it is possible to improve the amplification efficiency of the power amplifier circuit 1d as compared to during the first operation. In other words, with the power amplifier circuit 1d according to the fourth embodiment, a decrease in amplification efficiency is suppressed.

In the power amplifier circuit 1d according to the fourth embodiment, the phase adjustment circuit 117 is provided in the second signal path R2; however, the configuration is not limited thereto. The phase adjustment circuit 117 may be provided in, for example, the first signal path R1. In other words, the first signal path R1 may be a specific signal path.

(Aspects)

The following aspects are disclosed in the specification.

A power amplifier circuit (1; 1a to 1d) according to a first aspect includes multi-stage amplifier units (10; 10a to 10d), an ET terminal (101), and an APT terminal (102). The multi-stage amplifier units (10; 10a to 10d) include a final-stage amplifier unit (11; 11a to 11d). The final-stage amplifier unit (11; 11a to 11d) includes a first amplifier element (111) and a second amplifier element (112) that are connected in parallel with each other. The first amplifier element (111) is connected to the ET terminal (101). The second amplifier element (112) is connected to the APT terminal (102).

According to this aspect, a higher-speed operation of the power amplifier circuit (1; 1a to 1d) is achieved.

In the power amplifier circuit (1; 1a to 1d) according to a second aspect, in the first aspect, a signal that is input to the ET terminal (101) is a signal that changes following an envelope of a radio-frequency signal that is input to the first amplifier element (111). A signal that is input to the APT terminal (102) is a signal that changes according to an average amplitude of the radio-frequency signal that is detected in each predetermined time period (T1, T2, T3).

According to this aspect, a higher-speed operation of the power amplifier circuit (1; 1a to 1d) is achieved.

In the power amplifier circuit (1; 1a to 1d) according to a third aspect, in the first aspect, a first power supply voltage (V1) that changes according to an amplitude of a radio-frequency signal that is input to the first amplifier element (111) is applied to the ET terminal (101). A second power supply voltage (V2) that changes according to a change in the amplitude of the radio-frequency signal that is input to the second amplifier element (112) and that changes at a lower frequency than the first power supply voltage (V1) is applied to the APT terminal (102).

According to this aspect, a higher-speed operation of the power amplifier circuit (1; 1a to 1d) is achieved.

In the power amplifier circuit (1; 1a) according to a fourth aspect, in any one of the first to third aspects, a size of the first amplifier element (111) is smaller than a size of the second amplifier element (112).

According to this aspect, it is advantageous that the response of the first amplifier element (111) gets better.

In the power amplifier circuit (1; 1a) according to a fifth aspect, in any one of the first to third aspects, a size of the first amplifier element (111) is larger than a size of the second amplifier element (112).

According to this aspect, the loss of power consumption of the first amplifier element (111) is reduced.

In the power amplifier circuit (1; 1a) according to a sixth aspect, in any one of the first to fifth aspects, the multi-stage amplifier units (10; 10a) further include a driver-stage amplifier unit (12; 12a). The driver-stage amplifier unit (12; 12a) is connected to the APT terminal (102).

According to this aspect, it is possible to suppress a decrease in the response of the driver-stage amplifier unit (12; 12a) while achieving a higher-speed operation of the power amplifier circuit (1; 1a).

In the power amplifier circuit (1; 1a) according to a seventh aspect, in any one of the first to sixth aspects, the first amplifier element (111) and the second amplifier element (112) make up a differential amplifier circuit (20; 20a).

According to this aspect, the differential amplifier circuit (20; 20a) is implemented with a simple configuration.

The power amplifier circuit (1) according to an eighth aspect, in the seventh aspect, further includes a transformer (140). The transformer (140) is connected to an output end of the differential amplifier circuit (20).

According to this aspect, the band width of a radio-frequency signal is widened.

In the power amplifier circuit (1b, 1c, 1d) according to a ninth aspect, in any one of the first to third aspects, when a power level of a first signal that is input to the first amplifier element (111) becomes higher than or equal to a reference power level, the first amplifier element (111) amplifies the first signal and outputs a first amplified signal. Regardless of a power level of a second signal that is input to the second amplifier element (112), the second amplifier element (112) amplifies the second signal and outputs a second amplified signal.

According to this aspect, it is possible to improve the amplification efficiency.

The power amplifier circuit (1b) according to a tenth aspect, in the ninth aspect, further includes a splitter (13), a synthesis circuit (14), and a phase adjustment circuit (117).

The splitter (13) splits an input signal into the first signal and the second signal different in phase from the first signal. The synthesis circuit (14) includes a transformer (140) and synthesizes the first amplified signal with the second amplified signal. The phase adjustment circuit (117) is provided in a specific signal path and adjusts a phase of a signal that passes through the specific signal path. The specific signal path is one of a first signal path (R1) through which the first amplified signal passes and a second signal path (R2) through which the second amplified signal passes. The first signal path (R1) and the second signal path (R2) are connected to each other via the synthesis circuit (14).

According to this aspect, it is possible to set the phase of the first amplified signal and the phase of the second amplified signal to opposite phases, with the result that even harmonics of an output signal can be cancelled, and the amplitude of the output signal is amplified by multiple times.

The power amplifier circuit (1c) according to an eleventh aspect, in the ninth aspect, further includes a first splitter (13A), a second splitter (13B), a third amplifier element (164), a fourth amplifier element (165), a first synthesis circuit (14A), a second synthesis circuit (14B), a first phase adjustment circuit (117A), and a second phase adjustment circuit (117B). The first splitter (13A) splits a first input signal into the first signal and a third signal different in phase from the first signal. The second splitter (13B) splits a second input signal into the second signal and a fourth signal different in phase from the second signal. The third amplifier element (164) is connected in parallel with the first amplifier element (111) and amplifies the third signal and outputs a third amplified signal. The fourth amplifier element (165) is connected in parallel with the second amplifier element (112) and amplifies the fourth signal and outputs a fourth amplified signal. The first synthesis circuit (14A) includes a transformer (140) and synthesizes the first amplified signal with the third amplified signal. The second synthesis circuit (14B) includes a transformer (140) and synthesizes the second amplified signal with the fourth amplified signal. The first phase adjustment circuit (117A) is provided in a first specific signal path and adjusts a phase of a signal that passes through the first specific signal path. The first specific signal path is one of a first signal path (R1) through which the first amplified signal passes and a second signal path (R2) through which the second amplified signal passes. The second phase adjustment circuit (117B) is provided in a second specific signal path and adjusts a phase of a signal that passes through the second specific signal path. The second specific signal path is one of a third signal path (R3) through which the third amplified signal passes and a fourth signal path (R4) through which the fourth amplified signal passes.

According to this aspect, it is possible to further improve the amplification efficiency.

The power amplifier circuit (1d) according to a twelfth aspect, in the ninth aspect, further includes a phase adjustment circuit (117). The phase adjustment circuit (117) is provided in a specific signal path and adjusts a phase of a signal that passes through the specific signal path. The specific signal path is one of a first signal path (R1) through which the first amplified signal passes and a second signal path (R2) through which the second amplified signal passes. The first signal and the second signal are the same signal. The first signal path (R1) and the second signal path (R2) are directly connected.

According to this aspect, it is possible to amplify a signal without necessarily using a transformer, so the number of components is reduced.

A radio-frequency circuit (7; 7a) according to a thirteenth aspect includes the power amplifier circuit (1; 1a to 1d) of any one of the first to twelfth aspects, a first power supply circuit (2), and a second power supply circuit (3). The first power supply circuit (2) is connected to the ET terminal (101) and generates a first power supply voltage (V1) that changes according to an amplitude of a radio-frequency signal that is input to the first amplifier element (111). The second power supply circuit (3) is connected to the APT terminal (102) and generates a second power supply voltage (V2) that changes according to a change in the amplitude of the radio-frequency signal that is input to the second amplifier element (112) and that changes at a lower frequency than the first power supply voltage (V1).

According to this aspect, a higher-speed operation of the power amplifier circuit (1; 1a to 1d) is achieved.

A communication device (8) according to a fourteenth aspect includes the radio-frequency circuit (7; 7a to 7d) of the thirteenth aspect, and a signal processing circuit (5). The signal processing circuit (5) processes the radio-frequency signal and outputs the radio-frequency signal to the radio-frequency circuit (7; 7a to 7d). The power amplifier circuit (1; 1a to 1d) of the radio-frequency circuit (7; 7a to 7d) amplifies the radio-frequency signal that is input from the signal processing circuit (5).

According to this aspect, a higher-speed operation of the power amplifier circuit (1; 1a to 1d) is achieved.

REFERENCE SIGNS LIST 1, 1a, 1b, 1c, 1d power amplifier circuit
2 first power supply circuit
3 second power supply circuit
4 filter circuit
5 signal processing circuit
6 antenna
7, 7a, 7b, 7c, 7d radio-frequency circuit
8 communication device
10, 10a, 10b, 10c, 10d multi-stage amplifier units
11, 11a, 11b, 11c, 11d final-stage amplifier unit
12, 12a, 12c driver-stage amplifier unit
13 splitter
13A first splitter
13B second splitter
14 synthesis circuit
14A first synthesis circuit
14B second synthesis circuit
15 output matching circuit
17 splitter
20, 20a, 20b, 20c, 20d differential amplifier circuit
51 RF signal processing circuit
52 baseband signal processing circuit
71 signal input terminal
72 antenna terminal
101 ET terminal
102 APT terminal
111 first amplifier element
112 second amplifier element
113, 114 capacitor
115, 116 matching circuit
117 phase adjustment circuit
117A first phase adjustment circuit
117B second phase adjustment circuit
118, 119, 120 capacitor
121 amplifier element
122 capacitor
123 matching circuit
124 amplifier element
125 capacitor
130 transformer
131 primary winding
132 secondary winding
133 capacitor
134, 135, 136, 137, 138 capacitor
140 transformer
141 primary winding
142 secondary winding
143, 144, 145, 146 capacitor
151, 152 inductor
153, 154 capacitor
161, 162, 163 matching circuit
164 third amplifier element
165 fourth amplifier element
171 transformer
172, 173 capacitor
174 resistor
1711 primary winding
1712 secondary winding
M1, M2 middle point
P1, P2 junction point
R1 first signal path
R2 second signal path
R3 third signal path
R4 fourth signal path
V1 first power supply voltage
V2 second power supply voltage
V3 third power supply voltage

The invention claimed is:

1. A power amplifier circuit comprising:
a multi-stage amplifier comprising a final-stage amplifier;
an envelope tracking (ET) terminal; and
an average power tracking (APT) terminal,
wherein the final-stage amplifier comprises a first unit amplifier and a second unit amplifier connected in parallel with each other,
wherein the first unit amplifier is connected to the ET terminal,
wherein the second unit amplifier is connected to the APT terminal,
wherein when a power level of a first signal that is input to the first unit amplifier becomes greater than or equal to a reference power level, the first unit amplifier is configured to amplify the first signal and to output a first amplified signal, and
wherein regardless of a power level of a second signal that is input to the second unit amplifier, the second unit amplifier is configured to amplify the second signal and to output a second amplified signal.

2. The power amplifier circuit according to claim 1, wherein the ET terminal is configured to receive a signal that changes following an envelope of a radio-frequency signal that is input to the first unit amplifier, and
wherein the APT terminal is configured to receive a signal that changes according to an average amplitude of the radio-frequency signal that is detected in a predetermined time period.

3. The power amplifier circuit according to claim 1, wherein the ET terminal is configured to receive a first power supply voltage that changes according to an amplitude of a radio-frequency signal that is input to the first unit amplifier, and
wherein the APT terminal is configured to receive a second power supply voltage that changes according to a change in the amplitude of the radio-frequency signal that is input to the second unit amplifier and that changes at a lower frequency than the first power supply voltage.

4. The power amplifier circuit according to claim 1, wherein a size of the first unit amplifier is smaller than a size of the second unit amplifier.

5. The power amplifier circuit according to claim 1, wherein a size of the first unit amplifier is larger than a size of the second unit amplifier.

6. The power amplifier circuit according to claim 1,
wherein the multi-stage amplifier further comprises a driver-stage amplifier, and
wherein the driver-stage amplifier is connected to the APT terminal.

7. The power amplifier circuit according to claim 1, wherein the first unit amplifier and the second unit amplifier form a differential amplifier circuit.

8. The power amplifier circuit according to claim 7, further comprising:
a transformer connected to an output end of the differential amplifier circuit.

9. The power amplifier circuit according to claim 1, further comprising:
a splitter configured to split an input signal into the first signal and the second signal, the second signal having a different phase from the first signal;
a synthesis circuit comprising a transformer, and that is configured to synthesize the first amplified signal with the second amplified signal;
a first signal path through which the first amplified signal passes;
a second signal path through which the second amplified signal passes; and
a phase adjustment circuit in the first signal path or the second signal path, and that is configured to adjust a phase of the signal that passes through the first or second signal path,
wherein the first signal path and the second signal path are connected to each other via the synthesis circuit.

10. The power amplifier circuit according to claim 1, further comprising:
a first splitter configured to split a first input signal into the first signal and a third signal, the third signal having a different phase from the first signal;
a second splitter configured to split a second input signal into the second signal and a fourth signal, the fourth signal having a different phase from the second signal;
a third unit amplifier that is connected in parallel with the first unit amplifier, and that is configured to amplify the third signal and to output a third amplified signal;
a fourth unit amplifier that is connected in parallel with the second unit amplifier, and that is configured to amplify the fourth signal and to output a fourth amplified signal;
a first synthesis circuit that comprises a first transformer, and that is configured to synthesize the first amplified signal with the third amplified signal;
a second synthesis circuit that comprises a second transformer, and that is configured to synthesize the second amplified signal with the fourth amplified signal;
a first signal path through which the first amplified signal passes;
a second signal path through which the second amplified signal passes;
a third signal path through which the third amplified signal passes;
a fourth signal path through which the fourth amplified signal passes;
a first phase adjustment circuit that is in the first signal path or the second signal path, and that is configured to adjust a phase of the signal that passes through the first or second signal path; and
a second phase adjustment circuit that is in the third signal path or the fourth signal path, and that is configured to adjust a phase of the signal that passes through the third or fourth signal path.

11. The power amplifier circuit according to claim 1, further comprising:
a first signal path through which the first amplified signal passes;
a second signal path through which the second amplified signal passes; and
a phase adjustment circuit that is in the first signal path or the second signal, and that is configured to adjust a phase of the signal that passes through the first or second signal path,
wherein the first signal and the second signal are the same signal, and
the first signal path and the second signal path are directly connected.

12. A radio-frequency circuit comprising:
the power amplifier circuit according to claim 1;
a first power supply circuit that is connected to the ET terminal and that is configured to generate a first power supply voltage that changes according to an amplitude of a radio-frequency signal that is input to the first unit amplifier; and
a second power supply circuit that is connected to the APT terminal and that is configured to generate a second power supply voltage that changes according to a change in the amplitude of the radio-frequency signal that is input to the second unit amplifier and that changes at a lower frequency than the first power supply voltage.

13. A communication device comprising:
the frequency circuit according to claim 12; and
a signal processing circuit configured to process the radio-frequency signal and to output the radio-frequency signal to the radio-frequency circuit,
wherein the power amplifier circuit of the radio-frequency circuit is configured to amplify the radio-frequency signal that is input from the signal processing circuit.

* * * * *

UNITED STATES PATENT AND TRADEMARK OFFICE
CERTIFICATE OF CORRECTION

| | |
|---|---|
| PATENT NO. | : 12,438,507 B2 |
| APPLICATION NO. | : 17/805720 |
| DATED | : October 7, 2025 |
| INVENTOR(S) | : Kenji Tahara et al. |

Page 1 of 1

It is certified that error appears in the above-identified patent and that said Letters Patent is hereby corrected as shown below:

In the Specification

Column 4, Line 45, "processing circuit (see" should be --processing circuit 51 (see--

Column 7, Line 14, "filter circuit (see FIG. 2)." should be --filter circuit 4 (see FIG. 2).--

Column 7, Line 56, "signal processing circuit" should be --signal processing circuit 52--

In the Claims

Column 36, Line 49, "the frequency circuit" should be --the radio-frequency circuit--

Signed and Sealed this
Twenty-third Day of December, 2025

John A. Squires
*Director of the United States Patent and Trademark Office*